US009762077B2

(12) United States Patent
Desprez et al.

(10) Patent No.: US 9,762,077 B2
(45) Date of Patent: Sep. 12, 2017

(54) METHOD AND SYSTEM FOR MANAGING THE CHARGING OF A RECHARGEABLE BATTERY COMPRISING SEVERAL BRANCHES OF ELECTROCHEMICAL ELEMENTS CONNECTED IN PARALLEL

(71) Applicant: SAFT, Bagnolet (FR)

(72) Inventors: Philippe Desprez, Bordeaux (FR);
Sebastien Benjamin, Leognan (FR);
Ali Zenati, Jacksonville, FL (US);
Gerard Barrailh, Gradignan (FR)

(73) Assignee: SAFT, Bagnolet (FR)

( * ) Notice: Subject to any disclaimer, the term of this patent is extended or adjusted under 35 U.S.C. 154(b) by 120 days.

(21) Appl. No.: 14/902,089

(22) PCT Filed: Jul. 1, 2014

(86) PCT No.: PCT/EP2014/063926
§ 371 (c)(1),
(2) Date: Dec. 30, 2015

(87) PCT Pub. No.: WO2015/010860
PCT Pub. Date: Jan. 29, 2015

(65) Prior Publication Data
US 2016/0301219 A1 Oct. 13, 2016

(30) Foreign Application Priority Data

Jul. 4, 2013 (FR) ...................... 13 56576

(51) Int. Cl.
*H02J 7/00* (2006.01)
*H01M 10/0525* (2010.01)
(Continued)

(52) U.S. Cl.
CPC .......... *H02J 7/007* (2013.01); *G01R 31/3658* (2013.01); *G01R 31/3662* (2013.01);
(Continued)

(58) Field of Classification Search
CPC ....................................................... H02J 7/34
(Continued)

(56) References Cited

U.S. PATENT DOCUMENTS 6,060,864 A     5/2000  Ito et al.
6,121,752 A  *  9/2000  Kitahara ............. H01M 10/441
                                                  320/122
(Continued)

OTHER PUBLICATIONS

International Search Report for PCT/EP2014/063926 dated Sep. 11, 2014.

*Primary Examiner* — Edward Tso
*Assistant Examiner* — Ahmed Omar
(74) *Attorney, Agent, or Firm* — Sughrue Mion, PLLC

(57) ABSTRACT

The invention relates to a method and a system for managing the charging of a rechargeable battery by a voltage control or by a current control comprising a plurality (n) of branches connected in series, each branch comprising a plurality (p) of electrochemical elements connected in parallel. Each electrochemical element exhibits a charging profile (PC) comprising at least one plateau zone directly followed by a sloping zone in which the variation of the voltage as a function of the state of charge in the plateau zone is on average at least ten times less fast than the variation of the voltage in the sloping zone.

18 Claims, 13 Drawing Sheets

(51) Int. Cl.

| | |
|---|---|
| *H01M 10/44* | (2006.01) |
| *H02J 7/04* | (2006.01) |
| *G01R 31/36* | (2006.01) |
| *H01M 4/525* | (2010.01) |
| *H01M 4/58* | (2010.01) |
| *H01M 10/46* | (2006.01) |
| *H01M 4/02* | (2006.01) |
| *H01M 10/42* | (2006.01) |

(52) U.S. Cl.
CPC ......... *H01M 4/525* (2013.01); *H01M 4/5825* (2013.01); *H01M 10/0525* (2013.01); *H01M 10/441* (2013.01); *H01M 10/443* (2013.01); *H01M 10/448* (2013.01); *H01M 10/46* (2013.01); *H02J 7/04* (2013.01); *H01M 2004/028* (2013.01); *H01M 2010/4271* (2013.01); *Y02T 10/7011* (2013.01)

(58) Field of Classification Search
USPC .......................................................... 320/126
See application file for complete search history.

(56) References Cited

U.S. PATENT DOCUMENTS

| | | | |
|---|---|---|---|
| 7,573,233 B1 | 8/2009 | Chow et al. | |
| 7,573,234 B1 * | 8/2009 | Tsukamoto | ......... H01M 10/441 |
| | | | 320/116 |

* cited by examiner

METHOD AND SYSTEM FOR MANAGING THE CHARGING OF A RECHARGEABLE BATTERY COMPRISING SEVERAL BRANCHES OF ELECTROCHEMICAL ELEMENTS CONNECTED IN PARALLEL

CROSS REFERENCE TO RELATED APPLICATIONS

This application is a National Stage of International Application No. PCT/EP2014/063926 filed Jul. 1, 2014, claiming priority based on French Patent Application No. 13 56576 filed Jul. 4, 2013, the contents of all of which are incorporated herein by reference in their entirety.

TECHNICAL FIELD

The present invention relates to the technical field of methods for managing the charging of a rechargeable battery comprising a plurality of branches of electrochemical elements connected in parallel. The invention relates in particular to electrochemical elements having a charging profile comprising at least one zone in which the voltage does not vary in a continuously proportional manner with the state of charge.

The invention also relates to the electronic systems that make it possible to implement the method for managing the charging of this type of battery.

STATE OF THE ART

An electrochemical generator or accumulator (also called "element") is a device for producing electricity in which chemical energy is converted to electrical energy. The chemical energy is constituted by electrochemically active compounds deposited on at least one face of electrodes arranged in the element. The electrical energy is produced by electrochemical reactions while the element is discharging. The electrodes, arranged in a container, are electrically connected to current output terminals which ensure electrical continuity between the electrodes and an electricity consumer with which the element is associated.

A battery typically comprises a plurality of elements capable of being grouped together within one and the same enclosure. A battery can be divided into modules, each module being composed of a plurality of elements connected together in series and/or in parallel. The battery is intended to provide electrical energy for an external use. A charging circuit is generally provided, to which the battery can be connected in order to recharge the elements. A management system comprising measurement sensors and an electronic control circuit, developed to a greater or lesser extent depending on the uses, can be associated with the battery.

From the documents EP-A-2 144 075, EP-A-2 239 826 and EP-A-2 309 615, which relate to lithium-ion batteries, it is known to use, as positive electrode material for an element, lithium-containing phosphates of at least one transition metal, in particular compounds of the $LiMPO_4$ type, where M is chosen from the group comprising Fe, Co, Ni, Mn and a mixture thereof. These lithium-containing phosphates have a better thermal stability than the lithium-containing transition metal oxides of the $LiM^1O_2$ type conventionally used in lithium elements, where $M^1$ represents at least one transition element generally chosen from Co, Ni and Mn. The use of lithium-containing phosphates therefore makes it possible to reduce the risk of violent reactions when the accumulator is put under overload conditions.

It is also known to use, as active substance, a mixture comprising $LiMPO_4$ and a compound of the $LiM^1O_2$ type, where $M^1$ represents at least one transition element generally chosen from Co, Ni, Fe, Mn and Al. In particular, the document EP-A-2 269 954 discloses an electrochemically active substance which is a mixture, hereafter called "NCA/LFP type", comprising:

a) at least 10% by weight of a lithium-containing oxide comprising aluminium and transition metals containing at least nickel and cobalt; and b) at least 90% by weight of a lithium-containing phosphate of at least one transition metal, the surface of which is at least partially covered with a layer of carbon. This type of active substance offers a good compromise between high capacity and thermal stability.

In elements the positive electrode of which comprises an electrochemically active substance of the lithium-containing phosphate type or of the type described in the document EP-A-2 269 954, the voltage of the element varies very little as a function of its state of charge for a state of charge comprised between approximately 30 and approximately 90%.

It is noted that the state of charge (SOC) is determined as the amount of energy available in the battery relative to the energy of a fully charged battery. It is expressed as a percentage and reflects the remaining portion of energy available to the user. In this type of element, comprising at least one electrochemically active substance of the lithium-containing phosphate type, the variation in the open-circuit voltage, as a function of the state of charge, has a zone for a state of charge comprised between approximately 30 and approximately 90% in which the open-circuit voltage increases on average at least 10 times less quickly as a function of the state of charge than for a state of charge comprised between 90% and 100%.

By open-circuit voltage is meant the voltage measured at the terminals of the element when the latter is not discharging any current (OCV; according to *definition* 482-03-32 *of IEC standard* 60050-482:2004, *International Electrochemical Vocabulary part* 482: *Primary and secondary cells and batteries*).

By voltage variation as a function of the state of charge is meant either the voltage drift in relation to the state of charge or the relationship $$\frac{\Delta V}{\Delta SOC} = \frac{V_2 - V_1}{SOC_2 - SOC_1},$$

where:

$V_1$ and $V_2$ represent the values of voltages at two points situated on the curve of the voltage as a function of the state of charge, and $SOC_1$ and $SOC_2$ represent the states of charge corresponding to the voltage values $V_1$ and $V_2$.

For example, an element the positive electrode of which comprises an electrochemically active substance of the lithium iron phosphate $LiFePO_4$ type with 10% NCA charged at a current of C/5 amperes has a voltage which increases by approximately 0.5 millivolts per minute for a state of charge comprised between 30 and 90% and increases by approximately 20 millivolts per minute for a state of charge comprised between 90% and 100%, C being the nominal capacity of the element. Because of this very small variation in voltage, it is difficult to estimate, accurately, the state of charge of the element as a function of its voltage when the state of charge is comprised between approximately 30 and 90%.

FIG. 1 diagrammatically shows the charging profile (CP) of an element the positive electrode of which comprises an electrochemically active substance of the type described in the document EP-A-2 269 954.

The three main zones are shown:

Zone 1: this corresponds to a voltage less than or equal to VmaxZone1. A state of charge equal to MinSOCZone2 corresponds to the value VmaxZone1. VmaxZone1 is generally situated between 3 and 3.30 V and typically equals 3.25 V. MinSOCZone2 is generally situated in the range from 15 to 30%, typically 30%. In zone 1, the voltage varies almost proportionally with the state of charge; i.e. a given state of charge corresponds to a given voltage of the element. Zone 1 is subdivided again into a first state of charge zone comprised between 0 and less than 10%, in which the voltage of the element varies by more than 300 mV, and a second state of charge zone comprised between typically 10% and typically 30%, in which the voltage varies less quickly as a function of the state of charge, for example by approximately 100 mV for a 20% increase in state of charge.

Zone 23: this corresponds to a voltage greater than VmaxZone1 and less than VminZone4. VminZone4 is generally situated between 3.35 and 3.45 V, and typically equals 3.35 V. A state of charge equal to MaxSOCZone3 corresponds to the value VminZone4. MaxSOCZone3 is generally situated in the range from 80 to 95%, typically 90%. Zone 23 typically corresponds to the zone of voltages comprised between 3.25 V and 3.35 V corresponding to a state of charge typically comprised between 30% and typically 90%. A variation in voltage of the element of virtually zero can be noted for a state of charge comprised between 30% and 60% and for a state of charge comprised between 65% and 90%. In zone 23, the voltage of the element varies little, typically in the order of 100 mV for a state of charge comprised between approximately 30 and approximately 90%. This results in a high level of imprecision over the measurement of the state of charge in zone 23, as a given voltage value can correspond to a state of charge comprised within a wide range from 30 to 90%. Zone 23 is subdivided into two sub-zones, as shown by FIG. 2, which is an enlargement of FIG. 1: a first sub-zone: zone 2 ranging from MinSOCZone2 to MaxSOCZone2, i.e. from 30 to 60%, and a second sub-zone, zone 3 ranging from MinSOCZone3 to MaxSOCZone3, i.e. from 65 to 90%. Zones 2 and 3 meet towards a state of charge comprised between 60 and 65%.

Zone 4: this corresponds to a voltage greater than or equal to VminZone4. A state of charge equal to MaxSOCZone3 corresponds to the value VminZone4. VminZone4 corresponds to a state of charge of approximately 90%. In this zone, the voltage varies proportionally with the state of charge. It varies by approximately at least 300 mV. A given state of charge corresponds to a given voltage of the element.

This charging profile is common to compounds of the $LiMPO_4$ type where M is chosen from the group comprising Fe, Co, Ni, Mn and a mixture thereof.

In zone 1, the voltage variation of the element as a function of the state of charge for a state of charge less than MinSOCzone2 corresponding to a voltage Vmaxzone1 is on average at least 2 times faster than the voltage variation for a state of charge comprised between MinSOCZone2 and MaxSOCZone3.

A method is known from the document U.S. Pat. No. 7,940,027 B to manage the charging of a rechargeable battery comprising electrochemical elements connected in series and forming a branch. Each electrochemical element has a predetermined maximum continuous charging current IMR_C allowed for given temperature and state of charge conditions. Each branch comprises a current sensor making it possible to measure the current circulating in the electrochemical elements of the branch and a controller which permanently updates the maximum currents allowed in pulse charging (IMR) and in continuous charging (IMR_C) according to the method of the U.S. Pat. No. 7,940,027 B. A battery controller collects the measurements of the current passing through each of the branches as well as the maximum currents allowed in pulse charging (IMR) and in continuous charging (IMR_C) of each of the branches. This controller provides the charger with a pulsed and continuous current setpoint so that (by using a proportional integral type regulation) the current passing through each branch complies with these maximum allowed currents for pulse charging (IMR) and continuous charging (IMR_C).

In some uses requiring a large energy storage capacity, a large number of electrochemical elements must be connected in parallel in order to increase the capacity of the battery. With the solution proposed in the U.S. Pat. No. 7,940,027 B, the size of the device becomes very large because of all of the controllers needed to control each of the branches and the associated wiring for conveying all of the voltage measurements for the elements to the controller. Because of this, a significant volume is lost and an additional weight also reduces the performance of the system with regard to the volume energy or mass energy.

For each electrochemical couple, for example of the lithium-ion type, with elements directly connected in parallel, there is the risk of having different currents between the branches in particular during charging, leading to a premature ageing of the battery. The reasons for this difference in current can differ depending on the active substance (NCA/NMC where N is nickel, C is cobalt, A is aluminium and M is manganese or of the LFP type where L is lithium, F is iron and P is phosphate) of the positive electrode.

In fact, for electrochemical couples having a sloping evolution of the open-circuit voltage as a function of the SOC (such as for example lithium-ion with cathode material of the NCA/NMC type), the possible state of charge imbalances between elements connected in parallel will be able to be rebalanced during charging, during discharging and in the rest phases. However, a charging current greater than the current allowed for nominal ageing can arise due to the resistance dispersions of the elements, including the connections and the bus bars.

For electrochemical couples having a very minor evolution of the open-circuit voltage as a function of the SOC with a large plateau before the end of charge (such as for example iron phosphate LFP or an NCA/LFP mixture), or several plateaus (such as LFMP where L is lithium, F is iron, M is manganese and P is phosphate), there can also be charging currents greater than the current allowed for nominal ageing due to the resistance dispersions of the elements, including the connections and the bus bars, for an identical state of charge between elements.

Nevertheless the possible state of charge imbalances between elements connected in parallel will not be able to rebalance during charging, and thus when one element arrives at end of charge, i.e. in the sloping zone, before the others, the other elements will then have to absorb the charging current which passed through that element until then. The initial state of charge disparity originates from different self discharge rates, different resistances or different capacities during a full discharge which produces a "bottom-based" balancing. As the elements reach this sloping zone, the last element reaching the plateau will finally have a very large portion of the current of the battery passing through it.

If the current is too high during charging and in particular at end of charge, i.e. at the time when the acceptance of charging current is lower, it can cause the element to age very rapidly by depositing lithium on the negative electrode, reducing the capacity and/or increasing the resistance of the element. Such a premature ageing problem is known above all for alkaline batteries.

There is currently no method capable of being adapted satisfactorily to managing the charging of a rechargeable battery comprising branches of electrochemical elements connected in parallel, in particular for electrochemical elements of the lithium-ion type.

There is therefore a need for a system and a method for managing the charging that make it possible to charge such batteries without the risk of the electrochemical elements ageing too rapidly. In particular for electrochemical elements having a large plateau before the end of charge on their characteristic of open-circuit voltage as a function of the state of charge, there is a need to charge according to a current profile making it possible to comply with the charging current recommendations of the manufacturer of elements guaranteeing a nominal lifetime of the battery.

The recommendations for the maximum allowed charging currents of the batteries can be expressed as a maximum continuous current (IMR_C), but also, for shorter loads, as a maximum pulse charging current (IMR) for a given pulse duration or according to an algorithm.

SUMMARY OF THE INVENTION

To this end, the present invention proposes a method for managing the charging of a rechargeable battery comprising a plurality (p) of electrochemical elements connected in parallel. Each electrochemical element comprises an electrode comprising an active substance having a charging profile (CP) comprising at least one plateau zone directly followed by a sloping zone in which the voltage variation as a function of the state of charge in the plateau zone is on average at least 10 times slower than the voltage variation in the sloping zone. This method is used to manage the charging of a battery with electrochemical elements of the lithium-ion type.

The invention is therefore directed at a method for managing the charging of a rechargeable battery using a voltage control or using an intensity control comprising a plurality (n) of branches connected in series, each branch comprising a plurality (p) of electrochemical elements connected in parallel, each electrochemical element having a charging profile (CP) comprising at least one plateau zone directly followed by a sloping zone in which the voltage variation as a function of the state of charge in the plateau zone is on average at least 10 times slower than the voltage variation in the sloping zone, said method comprising the following steps:
 a) providing characteristic data of the electrochemical elements, the characteristic data comprising at least:
  a predetermined function representing the variation in the value of the internal resistance (Rcell) of an electrochemical element of the battery as a function of the temperature (T),
  a value of predetermined maximum charging current for an element (IMR, IMR_C) allowed as a function of the temperature (T), and
  the mean value of the voltage in the plateau zone (E0_plateau),
 b) real-time measurement of the voltage (Vcell_n) at the terminals of each branch of electrochemical elements connected in parallel;
 c) real-time measurement of the temperature (T) of the rechargeable battery;
 d) real-time evaluation of a control voltage (Vcontrol) equal to the sum of the mean value of the voltage in the plateau zone (E0_plateau) and the product of the value of the internal resistance (Rcell) of an electrochemical element and the value of the predetermined maximum charging current (IMR, IMR_C) allowed as a function of the measured temperature (T);
and in the case of an intensity control:
 e1) real-time evaluation of the maximum voltage (Vmax) of the electrochemical elements of the battery defined as being the maximum of the measured voltages (Vcell_n) at the terminals of each branch;
 e2) real-time evaluation of a threshold maximum instantaneous charging current passing through the electrochemical elements connected in parallel as a function of the evaluated control voltage (Vcontrol), by regulating the threshold maximum instantaneous charging current so that the maximum voltage (Vmax) of the electrochemical elements is equal to the evaluated control voltage (Vcontrol);
 e3) real-time determination of a maximum instantaneous charging current (IMR_parallel or IMR_C_parallel) to be applied to the electrochemical elements, in which the maximum instantaneous charging current is equal to the minimum between the evaluated threshold maximum instantaneous charging current and the product of the number (p) of electrochemical elements per branch and the predetermined maximum allowed charging current (IMR, IMR_C); and
 e4) real-time transmission of the value of the determined maximum instantaneous charging current (IMR_parallel or IMR_C_parallel) to a charger regulator integrated in the battery so as to power the electrochemical elements of the battery with an intensity less than or equal to the maximum of the determined maximum instantaneous charging current;
and in the case of a voltage control:
 f) real-time transmission of the value of the evaluated control voltage (Vcontrol) to a charger regulator integrated in the battery so as to power the electrochemical elements of the battery.

The method makes it possible to regulate the charging current of a battery composed of elements connected directly in parallel in order to guarantee an ageing identical to the ageing of an element the charging current of which complies with the maximum current prescribed for this element (called IMR or IMR_C). In this configuration, the only measurement available per branch of elements connected in parallel is the voltage measurement, as there is no current sensor per element. The invention uses this voltage, and in particular the maximum voltage from these voltages, to guarantee the maximum current passing through each element, providing the charger, depending on its type, with either a voltage setpoint or a current setpoint.

The method for managing the charging of the battery can be used whether the electrochemical elements are suitable for continuous or for pulsed charging.

According to an embodiment of the preceding method, the step of providing the characteristic data of the electrochemical elements is replaced with another step of providing characteristic data of the electrochemical elements comprising at least:
- a predetermined function representing the variation in the value of the internal resistance (Rcell) of an electrochemical element of the battery as a function of the temperature (T) and the state of charge of each electrochemical element (SOC) and/or the ageing state of each electrochemical element (SOH),
- a value of predetermined maximum charging current (IMR, IMR_C) allowed as a function of the temperature (T) and the state of charge of each electrochemical element (SOC) and/or the ageing state of each electrochemical element (SOH), and
- the value of the voltage in the plateau zone (E0) as a function of the temperature (T) and the state of charge of each electrochemical element (SOC) and/or the ageing state of each electrochemical element (SOH); and in which the step of real-time evaluation of the control voltage (Vcontrol) is replaced with another step of real-time evaluation of the control voltage (Vcontrol) equal to the sum of the mean value of the voltage in the plateau zone (E0) and the product of the value of the internal resistance (Rcell) of an electrochemical element and the value of the predetermined maximum charging current (IMR, IMR_C) allowed as a function of the measured temperature (T), and the measured state of charge of each electrochemical element (SOC) and/or the measured ageing state of each electrochemical element (SOH).

This embodiment makes it possible to take into account, for the management of the charging of the battery, parameters other than the temperature, such as the state of charge (SOC) and/or the ageing state (SOH) of the different electrochemical elements, making it possible to improve the management of the charging of the battery, optimally charging each electrochemical element.

In fact, the value of the characteristic voltage of the plateau zone E0 can depend on the state of charge of the battery (SOC), or even the temperature and/or the ageing state of the battery. Similarly, the resistance of the electrochemical elements can be characterized according to their state of charge and their temperature and/or their ageing state. The maximum current accepted during charging, which can be due for example to a deposit of lithium on a negative electrode made of carbon (graphite or other), can also depend on the state of charge and the temperature.

This embodiment thus makes it possible to manage the end of charge of the electrochemical elements, in particular by knowledge of the state of charge.

According to another embodiment, the method comprises the following steps:
- g1) providing the value of the end of charge voltage (Veoc) of the electrochemical elements;
- g2) providing a predetermined end of charge coefficient (Coef_eoc), the coefficient being less than the number (p) of electrochemical elements connected in parallel in each branch; and in the case of an intensity control, before the step e4 of real-time transmission of the value of the maximum instantaneous charging current (IMR_parallel or IMR_C_parallel) to a charger regulator integrated in the battery:
- h1) after the step e3 of real-time determination of the maximum instantaneous charging current (IMR_parallel or IMR_C_parallel) to be applied to the electrochemical elements, a step of real-time determination (S50) of a first intermediate maximum instantaneous charging current equal to the maximum between the evaluated threshold maximum instantaneous charging current and the product of the predetermined maximum allowed charging current (IMR, IMR_C) and the end of charge coefficient (Coef_eoc) is carried out;
- h2) in parallel with steps (S12) to (S50), a second intermediate maximum instantaneous charging current is evaluated (S52) in real time as a function of the value of the end of charge voltage (Veoc), by regulating the second threshold maximum instantaneous charging current so that the maximum voltage (Vmax) of the electrochemical elements is equal to the end of charge voltage (Veoc);
- h3) real-time determination (S54) of a maximum instantaneous charging current (IMR_parallel or IMR_C_parallel) to be applied to the electrochemical elements, in which the maximum instantaneous charging current is equal to the minimum between the evaluated first and second intermediate maximum instantaneous charging currents.

and in the case of a voltage control, before the step d of real-time evaluation of a control voltage, the following steps are carried out:
- i3) updating (S72) of a recorded end of charge variable (Flag_eoc), initially equal to zero; and
- i4) for as long as this end of charge variable (Flag_eoc) equals zero, the following are carried out:
  - the step d of real-time evaluation of a control voltage; and
  - if the value of the instantaneous current of the battery is greater than the product of the end of charge coefficient (Coef_eoc) and the value of the predetermined maximum allowed charging current (IMR, IMR_C), the value of the control voltage (Vcontrol, Vcontrol_C) evaluated in step d is transmitted in real time to a charger regulator integrated in the battery so as to power the electrochemical elements of the battery;
- i5) if this end of charge variable (Flag_eoc) equals one or if the value of the instantaneous current of the battery is less than or equal to the product of the end of charge coefficient (Coef_eoc) and the value of the predetermined maximum allowed charging current (IMR, IMR_C), a step (S74) of evaluation of a second control voltage is carried out, by regulating the predetermined maximum allowed instantaneous charging current so that the value of the instantaneous current of the battery is equal to the product of the end of charge coefficient Coef_eoc and the value of the predetermined maximum allowed charging current (IMR, IMR_C); and
  - if this evaluated second control voltage is less than the end of charge voltage (Veoc), the evaluated second control voltage (Vcontrol, Vcontrol_C) is transmitted in real time to a charger regulator integrated in the battery so as to power the electrochemical elements of the battery;
  - otherwise the end of charge voltage (Veoc) is transmitted in real time to a charger regulator integrated in the battery so as to power the electrochemical elements of the battery.

This embodiment makes it possible to carry out the end of charge on the sloping zone, i.e. very fast variations in the open-circuit voltage with the state of charge (SOC), of the couple without knowledge of the state of charge (SOC), unlike the preceding embodiment, which requires knowledge of the state of charge (SOC).

According to a preferred sub-embodiment, the end of charge coefficient (Coef_eoc) is equal to 1 in order to prevent any risk of exceeding the charging current of an electrochemical element during the end of charge of the battery.

According to a variant of this preferred sub-embodiment, the end of charge coefficient (Coef_eoc) is comprised between a third and half of the number of electrochemical elements per branch. Such a value makes it possible to prevent any high current at an electrochemical element while reducing the charging time in relation to a value equal to 1. These values are preferred in the case of a system having a variation in the open-circuit voltage (OCV) as a function of the state of charge in the order of 500 mV/10% of the capacity of the element, as is the case for elements of the NCA/LFP type, which will be defined below.

Another subject of the invention is a battery charging regulator comprising a memory comprising a program which implements the method described above, in which the regulator limits, or provides information making it possible to limit, the charging current (I) to the determined value of the maximum allowed instantaneous charging current (IMR, IMR_C).

Another subject of the invention is a rechargeable battery comprising at least two branches connected in series, each branch comprising at least two electrochemical elements connected in parallel and a charging regulator such as described previously, each electrochemical element having a charging profile (CP) comprising at least one plateau zone directly followed by a sloping zone in which the voltage variation as a function of the state of charge in the plateau zone is on average at least 10 times slower than the voltage variation in the sloping zone.

According to an embodiment, each electrochemical element is of the lithium-ion type.

According to a preferred embodiment, each electrochemical element is of the lithium-ion type comprising at least one active substance for the positive electrode chosen from the list consisting of:
- a compound, of the LMFP type, with the formula $Li_xMn_{1-y-z}M'_yM''_zPO_4$ where M' and M'' are chosen from the group consisting of B, Mg, Al, Si, Ca, Ti, V, Cr, Fe, Co, Ni, Cu, Zn, Y, Zr, Nb and Mo, and in which M' and M'' are different from each other, $0.8 \le x \le 1.2$, $0 \le y \le 0.6$ and $0 \le z \le 0.2$; and
- a compound, of the LFP type, with the formula $Li_xFe_{1-y}M_yPO_4$ where M is chosen from the group consisting of B, Mg, Al, Si, Ca, Ti, V, Cr, Mn, Co, Ni, Cu, Zn, Y, Zr, Nb and Mo, and in which $0.8 \le x \le 1.2$ and $0 \le y \le 0.6$.

According to another preferred embodiment, each electrochemical element is of the lithium-ion type, the positive electrode of which comprises:
a) a lithium-containing oxide comprising aluminium and transition metals containing at least nickel and cobalt; and
b) a lithium-containing phosphate of at least one transition metal; and the surface of the positive electrode of which is at least partially covered with a layer of carbon; and
in which the proportion by mass of the lithium-containing oxide of transition metals containing at least nickel, cobalt and aluminium is less than or equal to 10% of the weight of the composition;
and in which the proportion by mass of the lithium-containing phosphate of at least one transition metal is greater than or equal to 90% of the weight of the composition.

The lithium-containing oxide of transition metals containing at least nickel, cobalt and aluminium has the formula $Li_w(Ni_xCo_yAl_z)O_2$, where w ranges from 0.9 to 1.1; x>0; y>0; z>0, and the lithium-containing phosphate of at least one transition metal has the formula $Li_aM_bP_cO_{4-t}$ where M is chosen from Fe, Mn, Co and Ni, preferably Fe; a, b and c range from 0.9 to 1.1; t is less than or equal to 0.4.

Another subject of the invention is a computer program product comprising at least one sequence of instructions stored in and accessible to a processor, where execution by the processor leads to the implementation of the steps of the method described above.

Another subject of the invention is a data medium that can be read by a computer, making it possible to implement at least one of the sequences of instructions of the computer program product.

DESCRIPTION OF THE FIGURES

FIGS. 4 and 5 show a flowchart diagrammatically illustrating the principle for managing the charging of a battery according to a first embodiment of the invention by establishing a current setpoint for managing the continuous or pulsed charging currents of the elements, only taking into account the temperature (T) of the electrochemical elements.

FIGS. 6 and 7 show a flowchart diagrammatically illustrating the principle for managing the charging of a battery according to this first embodiment of the invention by establishing a voltage setpoint.

FIGS. 8 and 9 show a flowchart diagrammatically illustrating the principle for managing the charging of a battery according to a second embodiment of the invention by establishing a current setpoint for managing the continuous or pulsed charging currents of the elements, taking into account both the temperature (T) and the state of charge (SOC) of the electrochemical elements.

FIGS. 10 and 11 show a flowchart diagrammatically illustrating the principle for managing the charging of a battery according to a third embodiment of the invention by establishing a current setpoint.

FIG. 12 shows a flowchart diagrammatically illustrating the principle for managing the charging of a battery according to a third embodiment of the invention respectively by establishing a voltage setpoint making it possible to effectively manage the charging currents of the elements.

FIG. 13 shows the evolution of the current (Ibat) and of the voltage (Vbat) of the battery during charging, as well as the evolution of the currents in each electrochemical element (Icell_p for p=1 to 5) of the battery in the case where the charging of the battery is managed using a method according to the first embodiment of the invention.

FIG. 14 shows the charging profile of the electrochemical elements used in the simulations.

FIGS. 15 and 16 relate to the management of the continuous-mode charging of a battery having elements of one and the same branch initially unbalanced, according to a conventional management method and according to the invention respectively.

FIGS. 17 and 18 relate to the management of the pulsed-mode charging of a battery having elements of one and the same branch initially unbalanced, according to a conventional management method and according to the invention respectively.

DETAILED DESCRIPTION OF THE INVENTION

The invention provides a method for managing the charging of a rechargeable battery comprising at least two elements directly connected in parallel without the risk of premature ageing of the elements.

A—Description of a Battery According to the Invention

The battery according to the invention comprises at least two branches connected together in a series configuration, each branch comprises at least two electrochemical elements (or cells) Cell_p_n connected together in a parallel configuration and a charging regulator suitable for managing the charging of the electrochemical elements.

Each electrochemical element Cell_p_n has a charging profile CP comprising at least one plateau zone directly followed by a sloping zone in which the voltage variation as a function of the state of charge in the plateau zone is on average at least 10 times slower than the voltage variation in the sloping zone.

Figure 1:
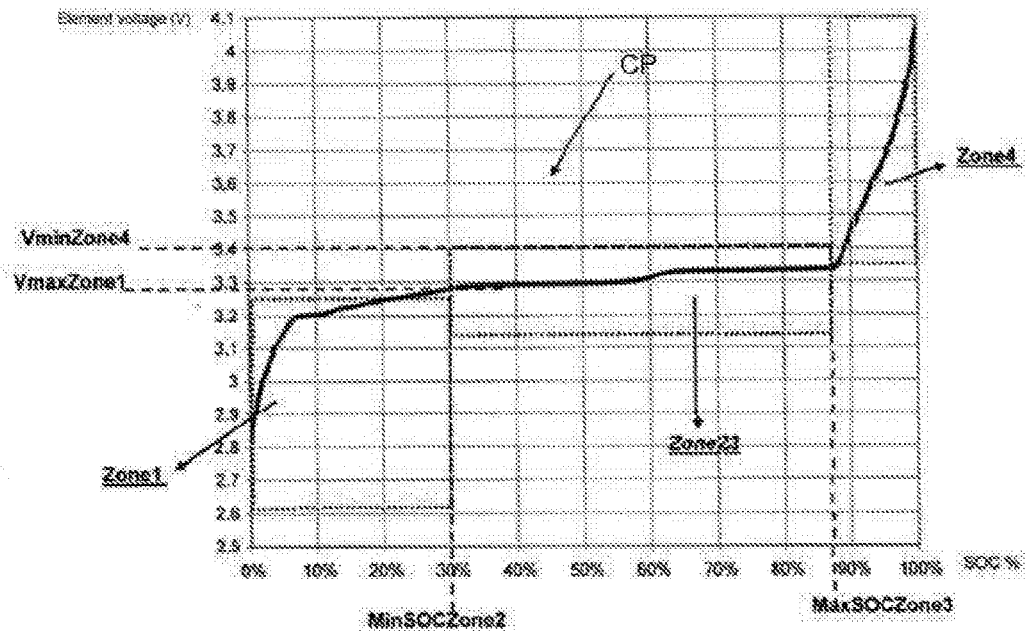
FIG. 1 shows the variation at 30° C. in the open-circuit voltage as a function of the state of charge of an element the positive electrode of which comprises an electrochemically active substance of the type described in the document EP-A-2 269 954.
Figure 2:
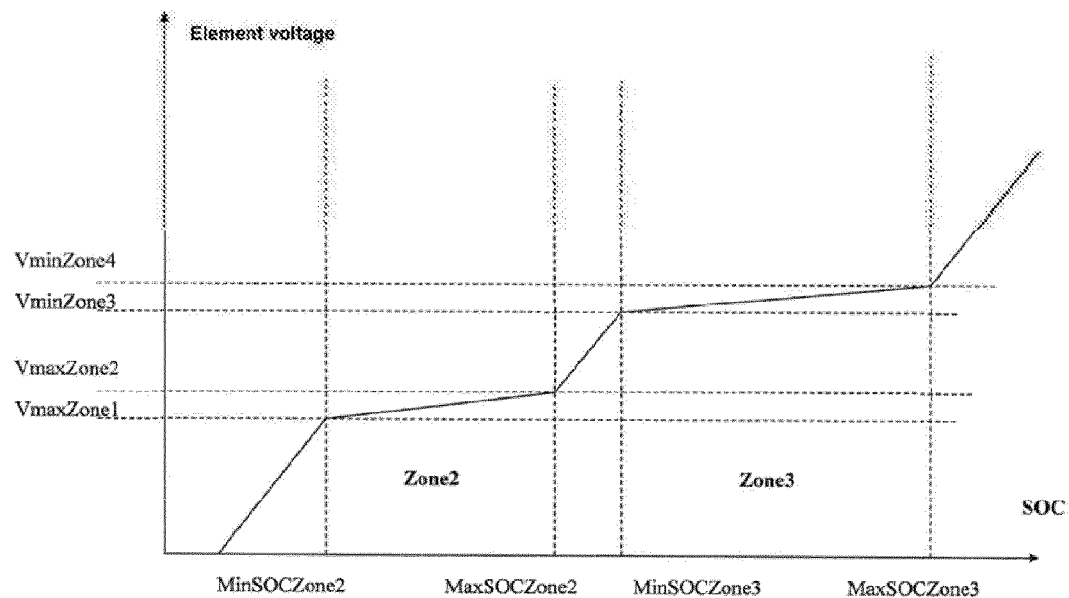
FIG. 2 is a diagrammatic enlargement of FIG. 1 in the zone 23.
Figure 3:
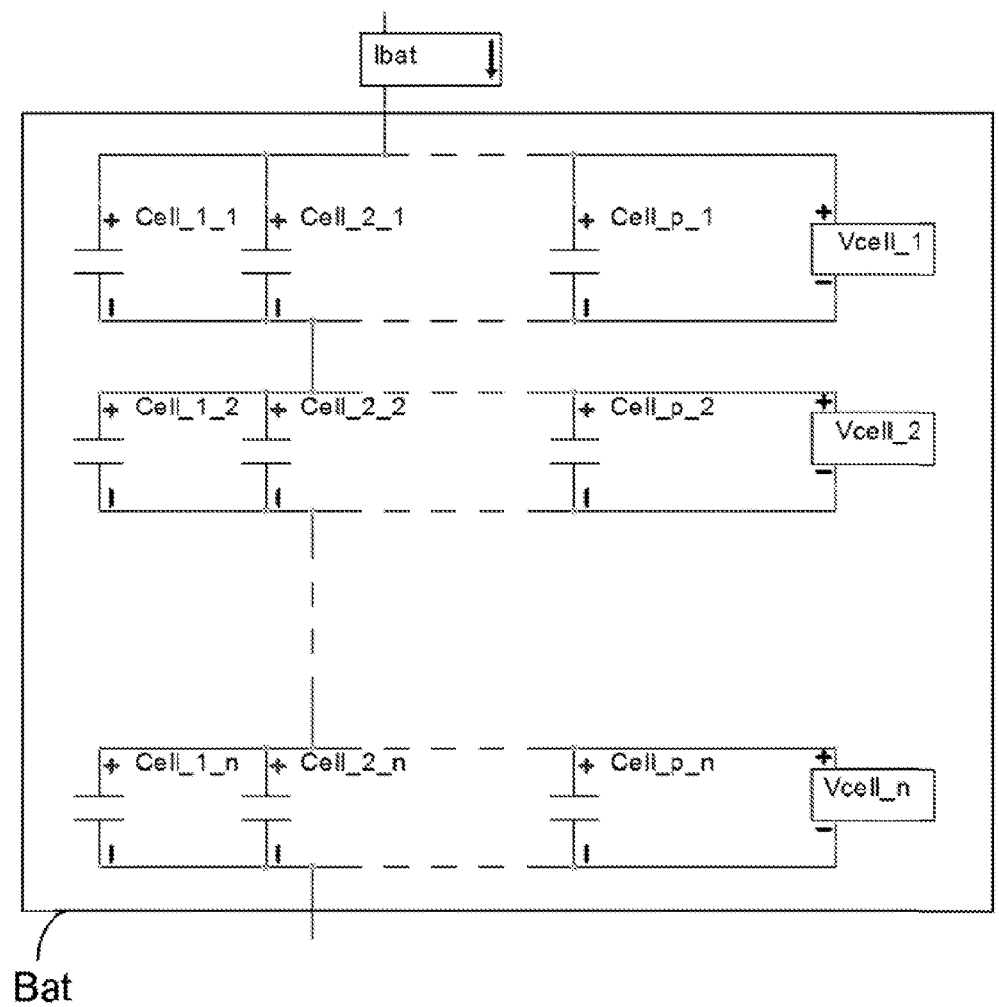
FIG. 3 shows a functional block diagram of the system for managing the state of charge of a battery in which a battery comprises n branches, each comprising n electrochemical elements (Cell_p_n).

FIG. 3 is a configuration example in which p electrochemical elements E_1_1 to E_p_1 are connected in parallel to form a first branch or module M1. Similarly, p electrochemical elements E_1_2 to E_p_2 are connected in parallel to form a second branch or module M2; p electrochemical elements E_1_n to E_p_n are connected in parallel to form an $n^{th}$ branch.

The n branches are connected in series to form a battery Bat. The branches of the battery are connected to a current source, which can be a charger or an application providing an unregulated charging current, as is the case in a hybrid vehicle during braking, when mechanical energy is converted to electrical energy. The current source provides a current Ibat.

Each branch is equipped with a means for measuring the voltage at its terminals Vcell_n. Preferably, an element is also equipped with a means making it possible to measure its operating temperature. This measurement means is placed at a carefully chosen point on the element in order to show its mean and/or maximum and/or minimum temperature. If the battery comprises a plurality of elements, each element can be equipped with a temperature sensor, but that makes the electronic circuits more complex.

In the case of branches grouping different electrochemical elements together, the means for measuring voltage and temperature can be grouped together within an electronic system (Si), associated with a branch. Each electronic system can also comprise a memory making it possible to store the ageing state of the elements. The ageing state of an element can be characterized by the parameter SOH ("State of Health") which indicates the degree of ageing of the module between a new state and an end of life state. A person skilled in the art has available several techniques that make it possible for him to calculate the ageing state of an element or of a module. The ageing state of an element can be calculated for example either from the ratio of the impedance of the element at a given time to the impedance of the element in the new state at the same temperature or from the estimate of the loss of capacity compared with the capacity of the element in the new state.

The battery can also comprise a system suitable for determining the state of charge of each branch individually for example according to the method described in the patent application FR 1 251 925. In this case, the system comprises an electronic management system G comprising a controller which:
  collects the measurement of the current I passing through each branch;
  collects the voltage measurements of each branch and optionally the temperature measurements;
  calculates the state of charge SOC of each branch by coulometry, taking into account the measurement error in respect of the value of the current;
  estimates the state of charge of each branch according to the method of the invention.

Only the "mean" state of charge of a branch, i.e. for all of the electrochemical elements of the branch connected in parallel, is calculated, as the current passing through each electrochemical element of the branch is not measured, in order to optimize the size and weight of the whole of the charging device and the battery.

Preferably, the system has at least one communication bus (BUS) for example (CAN, "Control Area Network", Ethernet) in order to provide a user with information on the status of the element or of the battery.

Also preferably, the controller collects the ageing state of the elements.

The system is suitable for estimating the state of charge of elements the positive active substance of which has a charging profile comprising at least one plateau zone directly followed by a sloping zone in which the voltage variation as a function of the state of charge in the plateau zone is on average at least 10 times slower than the voltage variation in the sloping zone.

Preferably, each electrochemical element is of the lithium-ion type.

According to a preferred embodiment, each electrochemical element is of the lithium-ion type comprising at least one active substance for the positive electrode chosen from the list consisting of:
- a compound, of the LMFP type, with the formula $Li_xMn_{1-y-z}M'_yM''_zPO_4$ where M' and M" are chosen from the group consisting of B, Mg, Al, Si, Ca, Ti, V, Cr, Fe, Co, Ni, Cu, Zn, Y, Zr, Nb and Mo, and in which M' and M" are different from each other, $0.8 \leq x \leq 1.2$, $0 \leq y \leq 0.6$ and $0 \leq z \leq 0.2$; and
- a compound, of the LFP type, with the formula $Li_xFe_{1-y}M_yPO_4$ where M is chosen from the group consisting of B, Mg, Al, Si, Ca, Ti, V, Cr, Mn, Co, Ni, Cu, Zn, Y, Zr, Nb and Mo, and in which $0.8 \leq x \leq 1.2$ and $0 \leq y \leq 0.6$.

According to another preferred embodiment, each electrochemical element is of the lithium-ion type, the positive electrode of which comprises:
a) a lithium-containing oxide of transition metals containing at least nickel, cobalt and aluminium; and
b) a lithium-containing phosphate of at least one transition metal;

and the surface of the positive electrode of which is at least partially covered with a layer of carbon; and
in which the proportion by mass of the lithium-containing oxide of transition metals containing at least nickel, cobalt and aluminium is less than or equal to 10% of the weight of the composition;
and in which the proportion by mass of the lithium-containing phosphate of at least one transition metal is greater than or equal to 90% of the weight of the composition.

The lithium-containing oxide of transition metals containing at least nickel, cobalt and aluminium has the formula $Li_w(Ni_xCo_yAl_z)O_2$, where w ranges from 0.9 to 1.1; $x>0$; $y>0$; $z>0$, and the lithium-containing phosphate of at least one transition metal has the formula $Li_aM_bP_cO_{4-t}$ where M is chosen from Fe, Mn, Co and Ni, preferably Fe; a, b and c range from 0.9 to 1.1; t is less than or equal to 0.4.

Such a battery is provided with parameters which depend on the electrochemical nature of the electrochemical cells or elements and their dimensions.

The parameters, all defined as positive, comprise the following:
IMR_C is the maximum continuous charging current allowed for an electrochemical element, expressed in amperes (A);
IMR is the maximum pulsed-mode charging current allowed for an electrochemical element, expressed in amperes (A);
Veoc is the maximum allowed charging voltage of the electrochemical elements, expressed in volts (V).

The maximum allowed continuous IMR_C or pulsed-mode IMR charging currents can be determined according to the method described in the U.S. Pat. No. 7,940,027 B.

The invention proposes a method for determining a maximum allowed charging current (IMR_Parallel for pulsed or IMR_C_Parallel for continuous) or a control voltage (Vcontrol for pulsed or Vcontrol_C for continuous), as a function of the type of charger at each moment in time. To provide these values of maximum allowed instantaneous charging current or control voltage, variables are measured or determined:
I is the instantaneous current which passes through the battery or cell, expressed in amperes (A), with I being positive during charging;
T is the temperature of the battery or the maximum of the temperatures measured by temperature sensors of the electrochemical elements of the battery at the time t. It is expressed in degrees Celsius (° C.);
Rcell is a predetermined table or law making it possible to obtain the value of the internal resistance of an electrochemical element at the start of the battery's life depending on the temperature of the battery and optionally also as a function of the state of charge and/or the ageing state of the battery. It is expressed in ohms (Ω);
Vmax(t) is the maximum of the voltages at the terminals of the electrochemical elements (or cells) of the battery at the time t:

$$V\max(t) = \max(V\text{cell}\_1, V\text{cell}\_2, \ldots, V\text{cell}\_n)$$

SOC is the state of charge of the battery or of the electrochemical elements (or cells) (%);
SOH: the ageing state of the battery or of the electrochemical elements (or cells) (%).

B) Description of the Method for Managing the Charging of the Battery

The method for managing the charging of a rechargeable battery such as described previously comprises a step of providing the characteristic data of the electrochemical elements. In particular, the characteristic data provided comprise at least data relating to the internal resistance of an electrochemical element of the battery, a value of predetermined maximum allowed charging current for an element and the mean value of the voltage in the plateau zone (E0_plateau).

The internal resistance (Rcell) of an electrochemical element can depend on the temperature of the battery. In this case a predetermined function representing the variation in the value of the internal resistance of the battery as a function of the temperature (T) is provided.

Similarly, the value of predetermined maximum allowed charging current for an element (IMR, IMR_C) depends on the temperature (T).

B1) Description of a First Embodiment of the Method According to the Invention

Figure 4:
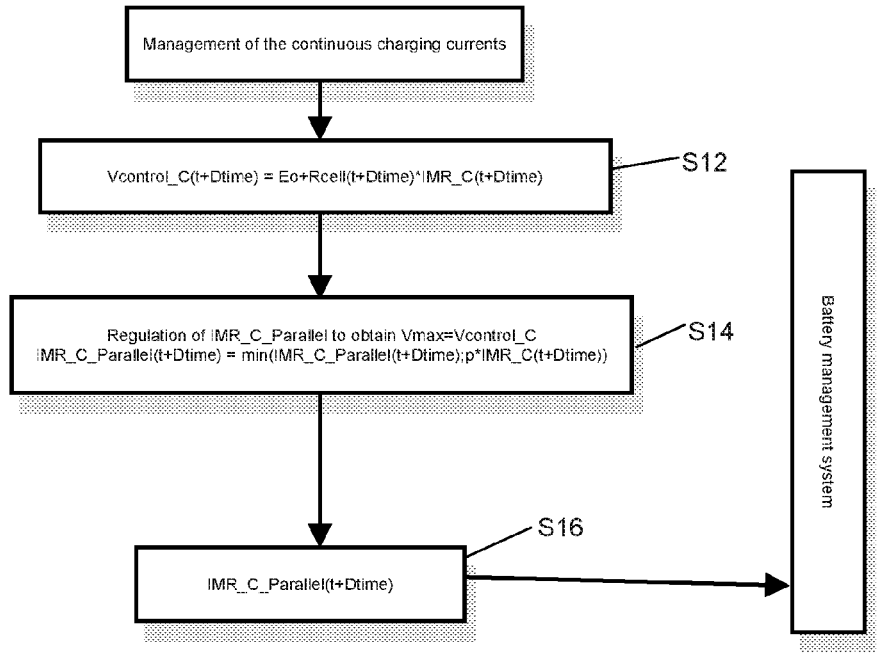
FIGS. 4 to 12 show flowcharts diagrammatically illustrating the principle for managing the charging of a battery according to different embodiments of the invention and in which the references used relate to the following parameters, all defined as positive:
- p is the number of electrochemical elements in parallel per branch;
- DTime is the updating period of the program which, when executed by a processor, makes it possible to implement the method for managing the charging according to the invention;
- IMR_C is the maximum continuous charging current allowed for an electrochemical element, expressed in amperes (A);
- IMR is the maximum pulsed-mode charging current allowed for an electrochemical element, expressed in amperes (A);
- Veoc is the maximum allowed charging voltage of the electrochemical elements, expressed in volts (V);
- I is the instantaneous current which passes through the battery or cell, expressed in amperes (A), with I being positive during charging;
- T is the temperature of the battery or the maximum of the temperatures measured by temperature sensors of the electrochemical elements of the battery at the time t. It is expressed in degrees Celsius (° C.);
- Rcell is a predetermined table or law making it possible to obtain the value of the internal resistance of an electrochemical element at the start of the battery's life depending on the temperature of the battery and optionally also as a function of the state of charge and/or the ageing state of the battery. It is expressed in ohms (Ω);
- Vmax(t) is the maximum of the voltages at the terminals of the electrochemical elements (or cells) of the battery at the time t;
- SOC is the state of charge of the battery or of the electrochemical elements (or cells) (%); and SOH is the ageing state of the battery or of the electrochemical elements (or cells) (%).

The method according to the invention proposes determining the maximum allowed instantaneous continuous charging current IMR_C_Parallel. The flowchart of FIG. 4 shows the calculation of this dynamic value of the allowed charging current.

This maximum allowed instantaneous charging current IMR is calculated using an algorithm implemented in a charging controller associated with the battery.

The method also comprises a step of real-time measurement of the voltage Vcell_n at the terminals of each branch n of electrochemical elements connected in parallel.

From this measured voltage, the maximum voltage Vmax of the electrochemical elements of the battery, defined as being the maximum of the measured voltages Vcell_n at the terminals of each branch n, is evaluated in real time.

The method also comprises a real-time measurement of the temperature T of the rechargeable battery.

The method continues with a step S12 of real-time evaluation of a control voltage Vcontrol_C equal to the sum of the mean value of the voltage in the plateau zone E0_plateau and the product of the value of the internal resistance Rcell of an electrochemical element and the value of the predetermined maximum charging current IMR_C allowed as a function of the measured temperature T:

$$V\text{control\_}C(t+D\text{time}) = E0\_\text{plateau} + R\text{cell}(t+D\text{time}) \times \text{IMR\_}C(t+D\text{time})$$

for a management of the continuous charging currents. Dtime is the updating period of the program carrying out the management of the charging according to the method, i.e. the frequency with which the measured or calculated data are refreshed.

From this evaluated control voltage Vcontrol_C, in S14 a threshold maximum instantaneous charging current passing through the electrochemical elements connected in parallel as a function of the evaluated control voltage Vcontrol_C is evaluated in real time, by regulating the threshold maximum instantaneous charging current so that the maximum voltage Vmax of the electrochemical elements is equal to the evaluated control voltage Vcontrol_C.

For example, the threshold maximum instantaneous charging current is reduced so that the maximum voltage Vmax of the electrochemical elements is equal to the evaluated control voltage Vcontrol_C as long as the maximum voltage Vmax is greater than the evaluated control voltage Vcontrol_C, and the threshold maximum instantaneous charging current is increased so that the maximum voltage Vmax of the electrochemical elements is equal to the evaluated control voltage Vcontrol_C as long as the maximum voltage Vmax is less than or equal to the evaluated control voltage Vcontrol_C.

According to other examples, the regulation can be of the proportional, integral or derivative type and combinations thereof, of the on-off type, hysteresis type, of the state feedback type or using a state observer.

This regulating step is equivalent to a well-known method for charging batteries called CCCV, for "Constant Current, Constant Voltage", carried out at the maximum usable current setpoint.

A maximum instantaneous charging current IMR_C_parallel can then be determined in real time. This is intended to be applied to the electrochemical elements. The maximum instantaneous charging current IMR_C_parallel is calculated so as to be equal to the minimum between the evaluated threshold maximum instantaneous charging current and the product of the number p of electrochemical elements per branch and the predetermined maximum allowed charging current IMR_C:

$$\text{IMR\_}C\_\text{Parallel} = \min(\text{IMR\_}C\_\text{Parallel}; p \times \text{IMR\_}C)$$

for a management of the continuous charging currents.

In S16 this value of the determined maximum instantaneous charging current IMR_C_parallel is transmitted in real time to a charger regulator integrated in the battery so as to power the electrochemical elements of the battery with an intensity less than or equal to the maximum of the determined maximum instantaneous charging current.

Figure 5:
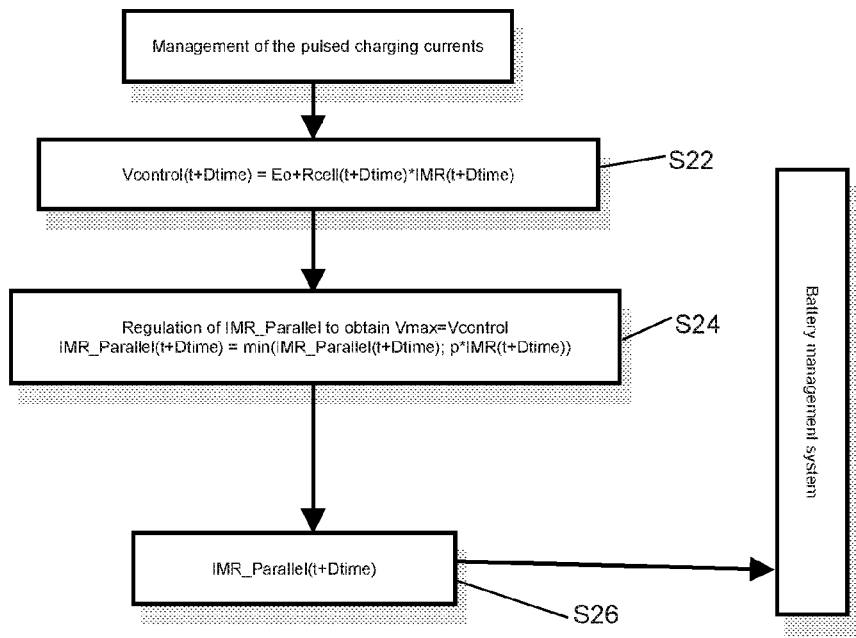

FIG. 5 shows the method according to the invention used to manage the charging of pulsed-mode currents. The steps described previously for the continuous mode all apply to the pulsed mode if the parameters relating to the continuous mode are replaced with the parameters relating to the pulsed mode, i.e. by replacing respectively:

- the continuous control voltage Vcontrol_C with the pulsed-mode control voltage Vcontrol;
- the maximum allowed continuous charging current IMR_C with pulsed-mode IMR; and
- the maximum instantaneous continuous charging current IMR_C_parallel with pulsed-mode IMR_parallel.

In the embodiment shown in FIG. 4 for the continuous mode, the maximum allowed continuous-mode charging current IMR_C_Parallel cannot exceed p times the maximum value per element IMR_C, i.e. p×IMR_C, where p times is the number of electrochemical elements per branch. A saturation value of the maximum allowed continuous-mode charging current IMR_C_Parallel at this maximum value makes it possible to increase the robustness of the algorithm vis-à-vis possible measurement imprecisions, for example of the voltage, or possible imprecisions of the characteristics, for example resistances of the elements or a possible exceeding of the setpoint by the regulator. This also applies to the maximum allowed pulsed-mode charging current, shown in FIG. 5, IMR_Parallel which cannot exceed p times the maximum value per element IMR, i.e. p×IMR.

Thus the method for managing charging according to this embodiment makes it possible to provide a charger with a setpoint of maximum allowed continuous-mode IMR_C_Parallel(t+DTime) or pulsed-mode IMR_Parallel(t+DTime) current at the time t+Dtime, which cannot be calculated directly, as the internal resistances of the electrochemical elements connected directly in parallel are not known at all times.

Moreover, it also makes it possible to provide the maximum voltage Vcontrol_C for a continuous charging or Vcontrol in order to make use of the pulse capacity of the batteries.

The first embodiment shown in FIGS. 4 (in continuous mode) and 5 (in pulsed mode) is suitable for managing the charging of the battery using an intensity control, also called control by a current setpoint provided to the charger. It makes it possible to guarantee the maximum current passing through each element, by providing the charger with a current setpoint.

Figure 6:
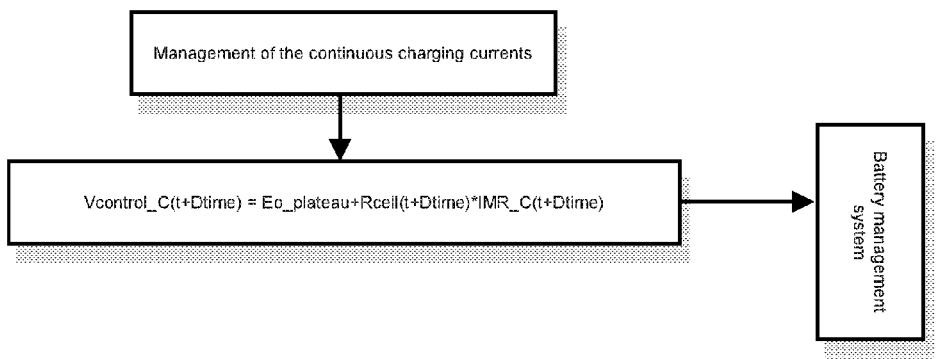
Figure 7:
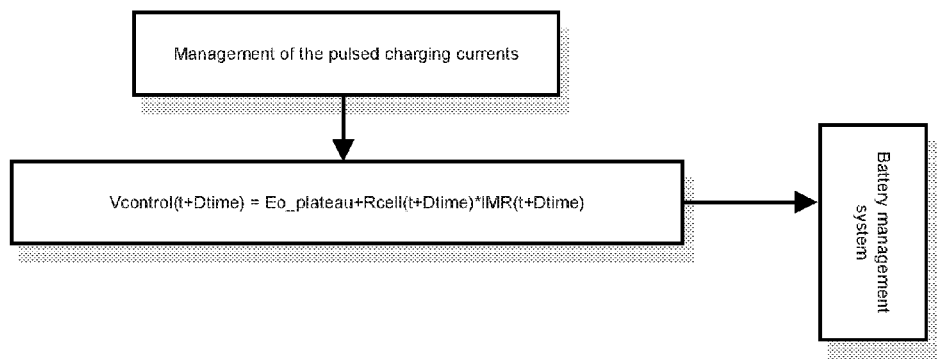

FIGS. 6 and 7 show an alternative to this first embodiment of a method for managing the charging of a battery according to the invention making it possible to guarantee the maximum current passing through each element, by providing the charger with a setpoint of continuous-mode or pulsed-mode voltage Vcontrol_C or Vcontrol respectively.

In the case of the chargers suitable for receiving a voltage setpoint, the method for managing the charging of the battery is carried out using a voltage control and comprises the same step of providing characteristic data of the electrochemical elements described previously. In particular, the characteristic data provided comprise at least data relating to the internal resistance Rcell of an electrochemical element of the battery, a value of predetermined maximum allowed charging current for an element IMR (in pulsed mode), IMR_C (in continuous mode) and the mean value of the voltage in the plateau zone (E0_plateau).

The method also comprises a real-time measurement of the temperature T of the rechargeable battery.

With regard to FIG. 6 for the continuous mode, the method continues with the same step S12 of real-time evaluation of a control voltage Vcontrol_C equal to the sum of the mean value of the voltage in the plateau zone E0_plateau and the product of the value of the internal resistance Rcell of an electrochemical element and the value of the predetermined maximum charging current IMR_C allowed as a function of the measured temperature T:

$$V\text{control\_}C(t+D\text{time}) = E0\_\text{plateau} + R\text{cell}(t+D\text{time}) \times \text{IMR\_}C(t+D\text{time})$$

for a management of the continuous charging currents.

This value of the determined control voltage Vcontrol_C defines a setpoint voltage which is transmitted in real time to a charger regulator integrated in the battery so as to charge the electrochemical elements of the battery under this control voltage.

Of course, this method for managing the charging of a battery using a voltage control is suitable for both continuous mode and pulsed mode. In this case shown in FIG. 7, the method continues with the same step S22 of real-time evaluation of a control voltage Vcontrol equal to the sum of the mean value of the voltage in the plateau zone E0_plateau and the product of the value of the internal resistance Rcell of an electrochemical element and the value of the predetermined maximum charging current IMR allowed as a function of the measured temperature T:

$$V\text{control}(t+D\text{time}) = E0\_\text{plateau} + R\text{cell}(t+D\text{time}) \times \text{IMR}(t+D\text{time})$$

for a management of the continuous charging currents.

It is this voltage Vcontrol that defines a setpoint voltage which is transmitted in real time to a charger regulator integrated in the battery so as to charge the electrochemical elements of the battery under this control voltage.

B2) Description of a Second Embodiment of the Method According to the Invention

In the embodiments shown in FIGS. 4 to 7, the values of the internal resistance Rcell, the predetermined maximum charging current IMR and IMR_C and the voltage in the plateau zone E0 only depend on the temperature T of the battery.

These values can also depend on the state of charge of each electrochemical element SOC and the ageing state of each electrochemical element SOH.

In fact, the value of the voltage in the plateau zone E0 can depend on the state of charge of the battery SOC and the temperature, or even its ageing state. Similarly, the value of the internal resistance Rcell of the electrochemical elements can be characterized according to their state of charge and their temperature, or even as a function of their ageing state. The maximum allowed charging current IMR or IMR_C, which can be due for example to a deposit of lithium at a negative electrode made of carbon (graphite or other), can also depend on the state of charge and the temperature, or even the ageing state.

The invention therefore proposes a charging method suitable for taking into account the dependences and the variations in these parameters as a function of the temperature T and/or the state of charge of each electrochemical element SOC and/or the ageing state of each electrochemical element SOH.

According to this embodiment, the method also comprises a step of measurement of the state of charge of each electrochemical element SOC and/or the ageing state of each electrochemical element SOH in real time.

In addition, the step of providing the characteristic data of the electrochemical elements is replaced with another step of providing characteristic data of the electrochemical elements comprising at least:

a predetermined function representing the variation in the values of the internal resistance Rcell of an electrochemical element of the battery as a function of the temperature T and the state of charge of each electrochemical element SOC and/or the ageing state of each electrochemical element SOH, a value of predetermined maximum allowed pulsed-mode IMR or continuous-mode IMR_C charging current as a function of the temperature T and the state of charge of each electrochemical element SOC and/or the ageing state of each electrochemical element SOH, and the value of the voltage in the plateau zone E0 as a function of the temperature T and the state of charge of each electrochemical element SOC and/or the ageing state of each electrochemical element SOH.

Moreover, the step S12 or S22 of real-time evaluation of the control voltage Vcontrol_C or Vcontrol is replaced with another step, S32 for continuous mode or S42 for pulsed mode, of real-time evaluation of the control voltage Vcontrol_C or Vcontrol equal to the sum of the mean value of the voltage in the plateau zone E0 and the product of the value of the internal resistance Rcell of an electrochemical element and the value of the predetermined maximum allowed charging current IMR_C or IMR as a function of the measured temperature T and, where appropriate, the measured state of charge of each electrochemical element SOC and/or the measured ageing state of each electrochemical element SOH.

Figure 8:
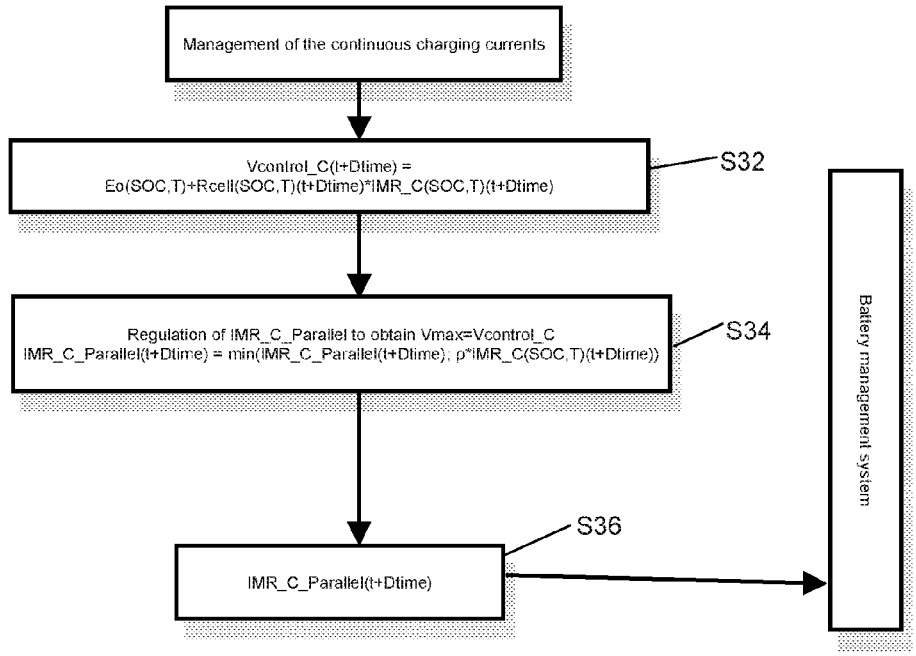
Figure 9:
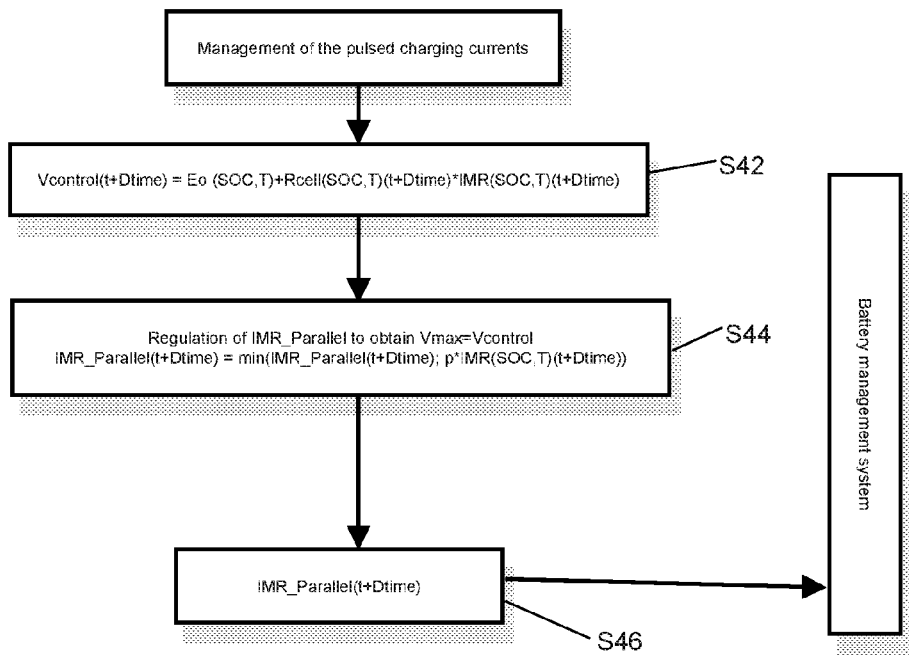

FIGS. 8 and 9 show examples of such a method in continuous mode and in pulsed mode respectively, in which the values of the internal resistance Rcell, the predetermined maximum charging current IMR and IMR_C and the voltage in the plateau zone E0 depend on both the temperature T of the battery and the state of charge of the cells of the battery.

Such a state of charge of the battery can be measured according to a method described in the patent application FR 1 251 925.

In this second embodiment shown in FIG. 8 for the continuous mode, as in the previous embodiment, the maximum allowed continuous-mode charging current IMR_C_Parallel cannot exceed p times the maximum value per element IMR_C, i.e. p×IMR_C, where p times is the number of electrochemical elements per branch. A saturation value of the maximum allowed continuous-mode charging current IMR_C_Parallel at this maximum value makes it possible to increase the robustness of the algorithm vis-à-vis possible measurement imprecisions, for example of the voltage, or possible imprecisions of the characteristics, for example resistances of the elements or a possible exceeding of the setpoint by the regulator. This also applies to the maximum allowed pulsed-mode charging current IMR_Parallel, which cannot exceed p times the maximum value per element IMR, i.e. p×IMR with regard to FIG. 9.

This embodiment makes it possible to take into account, all at once, the fluctuations in the internal resistance, the maximum allowed charging currents and the voltage in the plateau zone as a function of the temperature of the battery, the state of charge, or even the ageing state.

Because the state of charge is known, it is possible to optimally charge the electrochemical elements of the battery both in the plateau zone and at the end of charge.

This makes it possible in particular for the couples having a slight slope on the plateau to adopt the exact value of E0_plateau and not the mean thereof. This prevents overloading of the element if the mean voltage is too high or prevents increased charging times if the mean voltage is too low. This is similarly true for the resistance, where a mean value results locally in charging currents that are slightly too high or increased charging times.

Figure 10:
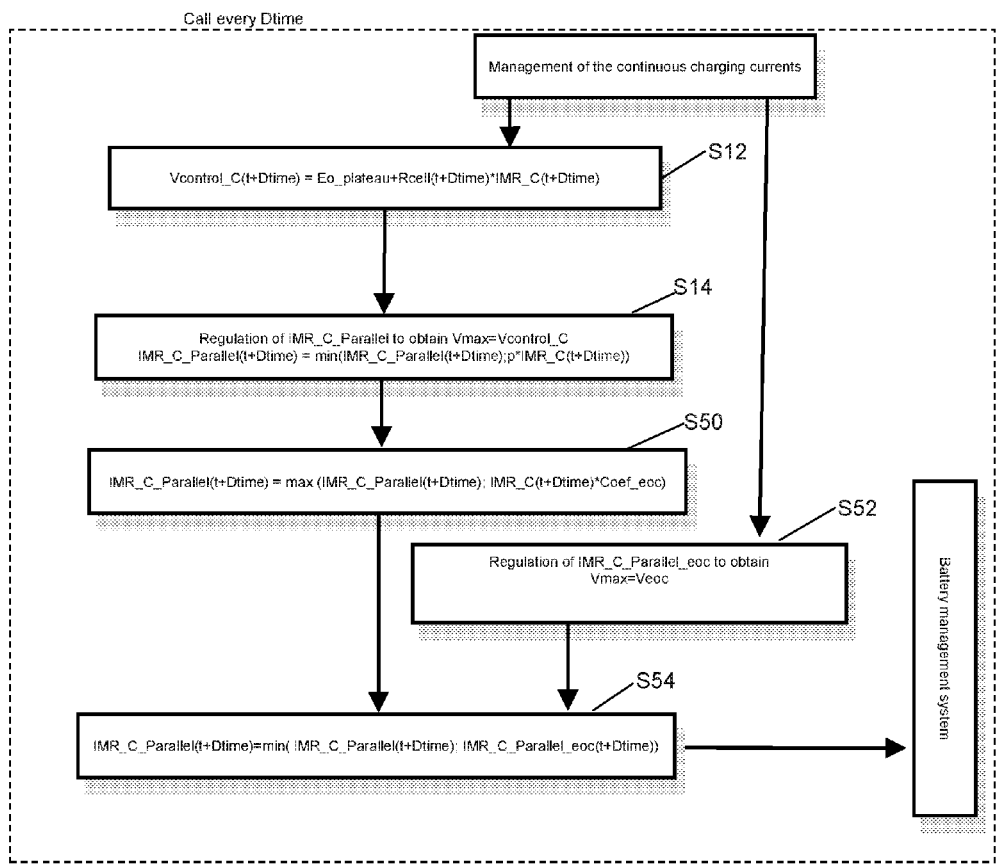

B3) Description of a Third Embodiment of the Method According to the Invention The flowchart of FIG. 10 shows an algorithm implemented in a charging controller associated with the battery to calculate the value of the maximum allowed instantaneous charging current, according to a third embodiment.

In the example shown in FIG. 10, the values of the internal resistance, the maximum allowed charging current and the voltage in the plateau zone only depend on the temperature.

The algorithm according to this third embodiment is identical to that of the first embodiment shown in FIG. 4 for the steps S12 and S14 that make it possible to manage the charging of the battery in the plateau zone of the charging profile (CP) of the electrochemical elements of the battery.

In order to manage the end of charge of the battery in this embodiment, the method comprises a step of providing the end of charge voltage Veoc of the electrochemical elements.

Moreover, the method also comprises a step of providing a predetermined end of charge coefficient, denoted Coef_eoc. This coefficient is smaller than the number p of electrochemical elements connected in parallel in each branch. This coefficient is characteristic of the passage of charging on the plateau zone of the charging profile CP to the more sloping zone.

The most robust value for this coefficient Coef_eoc is 1 because it prohibits any current greater than the allowed end of charge current. Nevertheless, in order to reduce the end of charge charging time, it is possible to define by tests, for example computer simulations or by calibration, greater values of Coef_eoc that avoid exceeding the allowed charging currents, typically between p/2 and p/3, where p is the number of electrochemical elements per branch connected in parallel.

After the step S14 of real-time determination of the maximum instantaneous continuous charging current IMR_C_parallel to be applied to the electrochemical elements and before the step of real-time transmission of the value of the maximum instantaneous charging current IMR_C_parallel to a charging regulator integrated in the battery, a step S50 of determination of a first intermediate maximum instantaneous charging current is carried out.

The first intermediate maximum instantaneous charging current is calculated in real time so as to be equal to the maximum between the evaluated threshold maximum instantaneous charging current and the product of the predetermined maximum allowed continuous charging current IMR_C and the end of charge coefficient Coef_eoc, in S50:

$$IMR\_C\_Parallel(t+Dtime)=\max(IMR\_C\_Parallel(t+Dtime); IMR\_C(t+Dtime)\times Coef\_eoc)$$

In parallel with steps S12 to S50, a second intermediate maximum instantaneous charging current, denoted IMR_C_Parallel_eoc, is evaluated in S52. By "in parallel" is meant a second calculation or evaluation independent of the one carried out in steps S12 to S50. These two calculations can be simultaneous or consecutive. This second intermediate maximum instantaneous charging current is intended to pass through the electrochemical elements connected in parallel. During this step of evaluation S52, the second intermediate maximum instantaneous charging current is evaluated in real time as a function of the value of the end of charge voltage Veoc, by regulating the second threshold maximum instantaneous charging current so that the maximum voltage Vmax of the electrochemical elements is equal to the end of charge voltage Veoc.

For example, the second intermediate maximum instantaneous charging current IMR_C_Parallel_eoc is reduced so that the maximum voltage Vmax of the electrochemical elements is equal to the end of charge voltage Veoc as long as the maximum voltage Vmax is greater than the end of charge voltage Veoc, and the second intermediate maximum instantaneous charging current is increased if the maximum voltage Vmax is less than the end of charge voltage Veoc.

According to other examples, the regulation can be of the proportional, integral or derivative type and combinations thereof, of the on-off type, hysteresis type, of the state feedback type or using a state observer.

This regulation step is also equivalent to a well-known method of charging batteries called CCCV, for "Constant Current, Constant Voltage", carried out at the maximum usable current setpoint.

Then, in S54, a maximum instantaneous charging current IMR_C_parallel is determined in real time. This maximum instantaneous charging current is intended to be applied to the electrochemical elements. It is determined so as to be equal to the minimum between the evaluated first and second intermediate maximum instantaneous charging currents, IMR_C_Parallel and IMR_C_Parallel_eoc:

$$IMR\_C\_Parallel(t+Dtime)=\min(IMR\_C\_Parallel(t+Dtime); IMR\_C\_Parallel\_eoc(t+Dtime))$$

This value is then transmitted in real time to a charger regulator integrated in the battery so as to power the electrochemical elements of the battery with an intensity less than or equal to the maximum of the determined maximum instantaneous charging current.

The value of the first intermediate maximum instantaneous charging current is suitable for managing the charging in the plateau zone and the value of the second intermediate maximum instantaneous charging current is suitable for managing the end of charge on the sloping zone of the electrochemical couple even without knowledge of the state of charge SOC of the electrochemical elements, which can be difficult to obtain.

Figure 11:
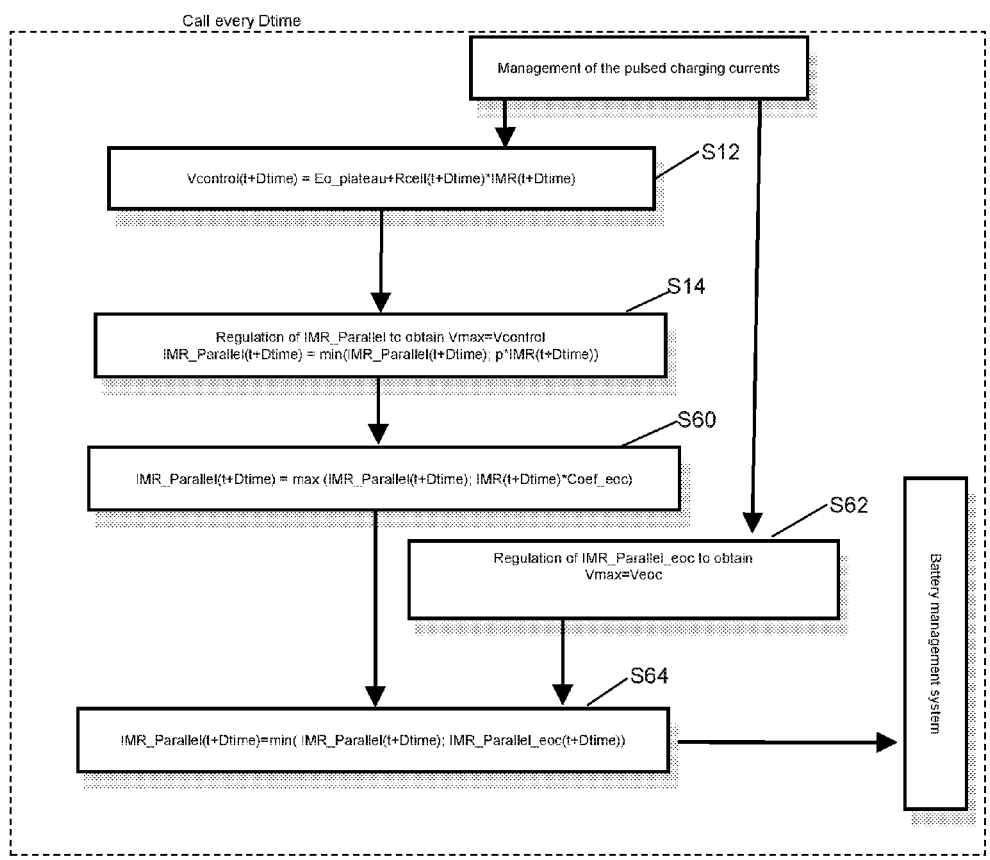

FIG. 11 shows the method according to the third embodiment of the invention applied to the management of the charging of pulsed-mode currents. The steps described previously for the continuous mode all apply to the pulsed mode if the parameters relating to the continuous mode are replaced with the parameters relating to the pulsed mode, i.e. by replacing respectively:

- the continuous control voltage Vcontrol_C with the pulsed-mode control voltage Vcontrol;
- the maximum allowed continuous charging current IMR_C with pulsed-mode IMR; and
- the maximum instantaneous continuous charging current IMR_C_parallel with pulsed-mode IMR_parallel.

This third embodiment is particularly well suited to electrochemical elements the charging profile of which has a plateau zone followed by a very rapid variation in the open-circuit voltage with the state of charge. It makes it possible, without knowledge of the state of charge SOC of the electrochemical elements, which can be difficult to obtain, to carry out the end of charge on the sloping zone of the couple.

In the examples shown in FIGS. 10 and 11, the values of the internal resistance, the maximum allowed charging current and the voltage in the plateau zone only depend on the temperature. Of course, their variations as a function of the state of charge, or even the ageing state, will also be able to be taken into account, as in the second embodiment, so that the management of the charging is more robust.

The embodiments shown in FIGS. 10 and 11 make it possible to guarantee the maximum current passing through each element, providing the charger with a current setpoint.

Figure 12:
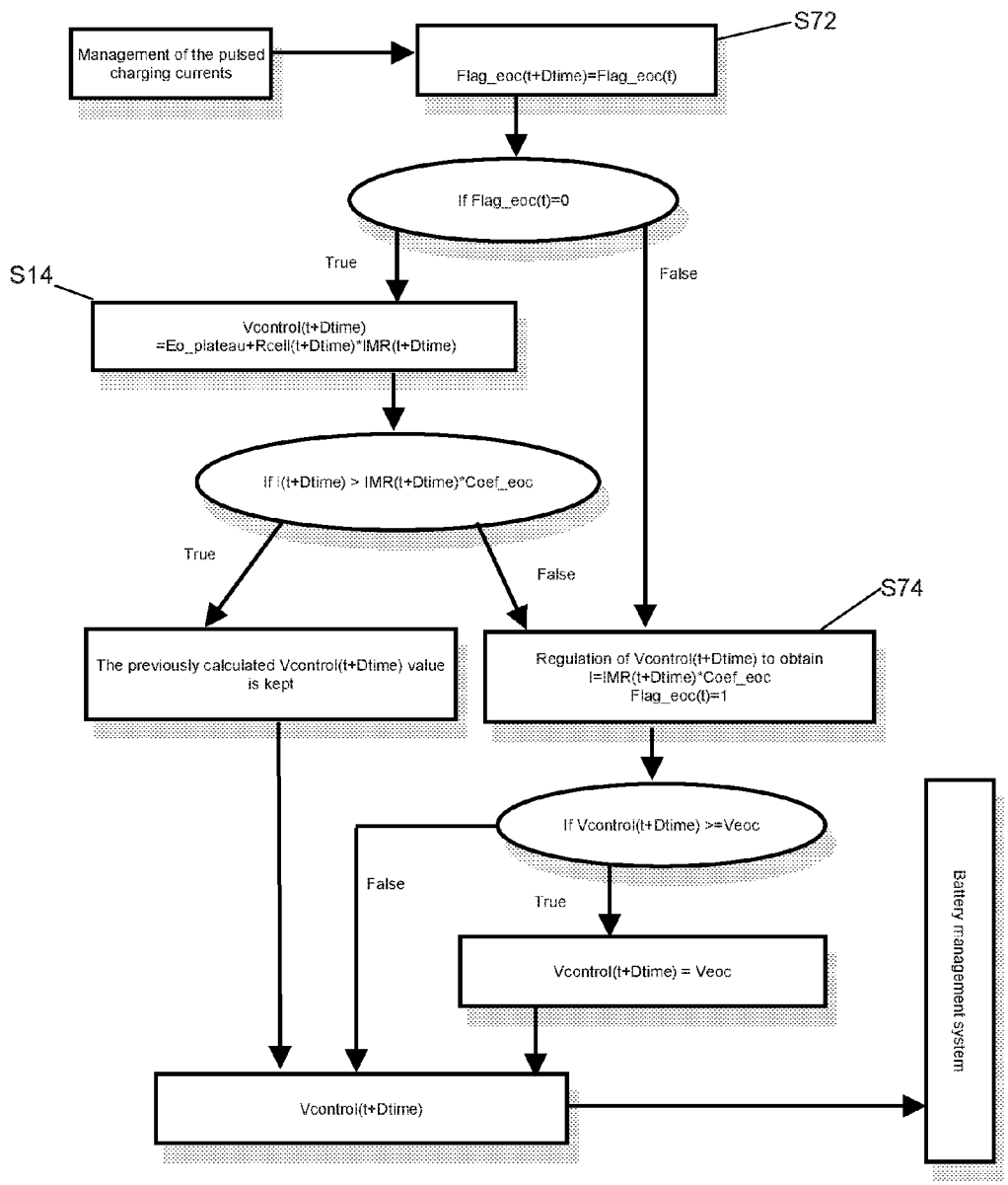

FIG. 12 shows an alternative to this third embodiment of a method for managing the charging of a battery according to the invention making it possible to guarantee the maximum current passing through each element, providing the charger with a setpoint of pulsed-mode voltage Vcontrol. Of course, the steps described below for the pulsed mode can be transposed to the continuous case.

According to this alternative shown in FIG. 12 for the pulsed mode, the method comprises the same step of providing the characteristic data of the electrochemical elements described previously. In particular, the characteristic data provided comprise at least data relating to the internal resistance Rcell of an electrochemical element of the battery, a value of predetermined maximum allowed charging current for an element IMR and the mean value of the voltage in the plateau zone (E0_plateau).

The method also comprises a real-time measurement of the temperature T of the rechargeable battery.

In order to manage the end of charge of the battery in this embodiment, the method also comprises a step of providing the end of charge voltage Veoc of the electrochemical elements and a predetermined end of charge coefficient Coef_eoc as described previously.

The method comprises, first of all, a step S72 of updating an end of charge variable denoted Flag_eoc. The updating is carried out in the period Dtime for updating the algorithm suitable for managing the charging of the battery when it is implemented by a processor. This variable equals 1 when the battery is at end of charge, i.e. in the sloping zone of the charging profile, and this variable is equal to zero outside this zone. Thus, as a function of its value, when in the plateau zone of the charging profile, i.e. Flag_eoc(t)=0, the method comprises the same step S22 as described previously of real-time evaluation of a control voltage Vcontrol equal to the sum of the mean value of the voltage in the plateau zone E0_plateau and the product of the value of the internal resistance Rcell of an electrochemical element and the value of the predetermined maximum charging current IMR allowed as a function of the measured temperature T:

$$V\text{control}(t+D\text{time})=E0\_\text{plateau}+R\text{cell}(t+D\text{time})\times IMR(t+D\text{time})$$

for a management of the pulsed-mode charging currents.

This voltage Vcontrol defines a setpoint voltage which is transmitted in real time to a charger regulator integrated in the battery so as to charge the electrochemical elements of the battery under this control voltage while still in the plateau zone of the charging profile, i.e. while the value of the instantaneous current of the battery is greater than the product of the end of charge coefficient Coef_eoc and the value of the predetermined maximum allowed pulsed-mode charging current IMR:

$$I(t+D\text{time})>IMR(t+D\text{time})\times \text{Coef\_eoc}$$

This step thus makes it possible to manage the charging of the battery in the plateau zone of the charging profile (CP) of the electrochemical elements of the battery.

The passage of the instantaneous current of the battery has a value less than or equal to the product of the end of charge coefficient Coef_eoc and the value of the predetermined maximum allowed pulsed-mode charging current IMR: $I(t+D\text{time})\leq IMR(t+D\text{time})\times \text{Coef\_eoc}$ is characteristic of the passage from the plateau zone to the sloping zone of the charging profile. This means that the electrochemical elements of the battery are at end of charge.

Thus as soon as the value of the instantaneous current of the battery is less than or equal to the product of the end of charge coefficient Coef_eoc and the value of the predetermined maximum allowed pulsed-mode charging current IMR: $I(t+D\text{time})\leq IMR(t+D\text{time})\times \text{Coef\_eoc}$, the end of charge variable denoted Flag_eoc equals 1.

In order to manage the end of charge of the electrochemical elements of the battery, the method comprises a step S74 of evaluation of a second control voltage.

This step is implemented as long as the variable denoted Flag_eoc equals 1.

During this step of evaluation S74, the second control voltage is evaluated in real time as a function of the value of the end of charge voltage Veoc, by regulating the predetermined maximum allowed instantaneous charging current so that the value of the instantaneous current of the battery is equal to the product of the end of charge coefficient Coef_eoc and the value of the predetermined maximum allowed pulsed-mode charging current IMR: $I(t+D\text{time})=IMR(t+D\text{time})\times \text{Coef\_eoc}$.

For example, the regulation is of the proportional, integral or derivative type and combinations thereof, of the on-off type, hysteresis type, of the state feedback type or using a state observer.

Then, if this second control voltage evaluated in step S74 is less than the end of charge voltage Veoc, it defines the setpoint voltage which is then transmitted in real time to a charger regulator integrated in the battery so as to charge the electrochemical elements of the battery under this control voltage until the end of charge is reached.

Otherwise, i.e. if this second control voltage evaluated in step S74 is greater than or equal to the end of charge voltage Veoc, the value of the second control voltage is replaced with the value of the end of charge voltage and it is this value that defines the setpoint voltage which is then transmitted in real time to a charger regulator integrated in the battery so as to charge the electrochemical elements of the battery under this control voltage until the end of charge is reached.

Of course, this method for managing the charging of a battery using a voltage control is suitable for both continuous mode and pulsed mode.

In the third embodiment of the invention where the management of the charging is controlled using a voltage or intensity setpoint, an end of charge coefficient Coef_eoc equal to 1 prevents any risk of exceeding the charging current of an element during the end of charge of the battery.

According to a preferred embodiment, the end of charge coefficient is comprised between a third and half of the number p of electrochemical elements per branch. Such a value makes it possible to prevent any high current at an element while reducing the charging time in relation to an end of charge coefficient equal to 1. These values are preferred in the case of the NCA/LFP-type systems, which have a charging profile the variation in the OCV of which as a function of the state of charge is in the order of 500 mV/10% of the capacity of the element in the sloping zone.

C) Examples

FIGS. 13 to 16 show results obtained by simulation making it possible to compare a conventional constant-current management method with a management method according to the invention.

The first simultaneous system is a battery comprising 5 elements of the NCA/LFP type connected directly in parallel.

The charging current is 5×10 A because it is desired ideally to charge at IMR_C=10 A per element connected in parallel.

In order to demonstrate the technical effect realized by a management method according to the invention, the element 1, denoted cell1, is charged to 30% while the other elements cell2 to cell5 are charged to only 10%. As a result, the electrochemical elements are initially at different charging states.

Figure 14:
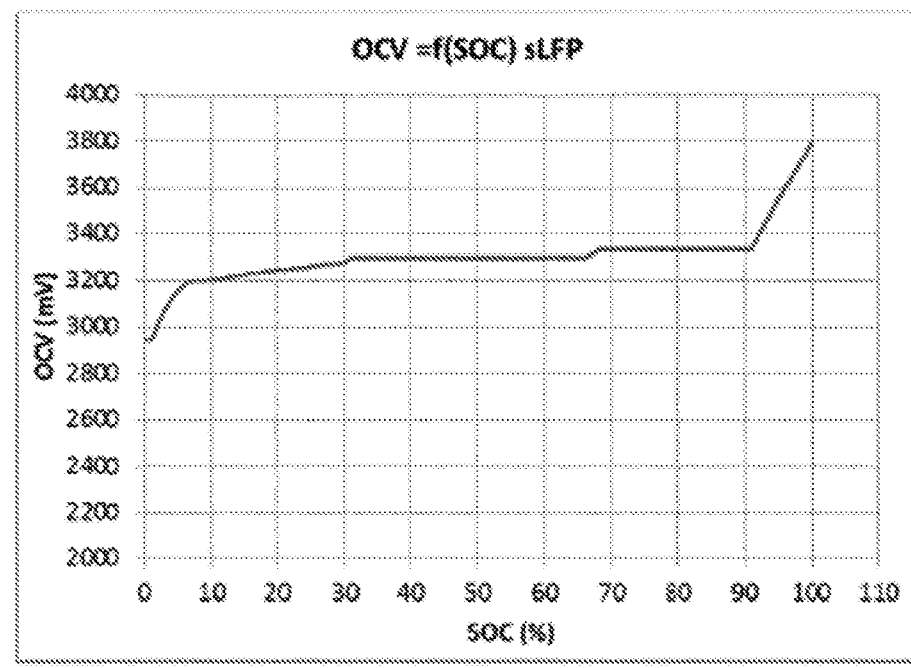

FIG. 14 shows the charging profile of the electrochemical elements used in the simulations.

The mean value of the plateau E0_plateau is 3.333 V and the end of charge voltage Veoc is 3.8 V.

The end of charge coefficient Coef_eoc for the charging method according to the invention is equal to p/3, i.e. 5/3, and the regulation used is of the proportional integral (PI) type.

Figure 13:
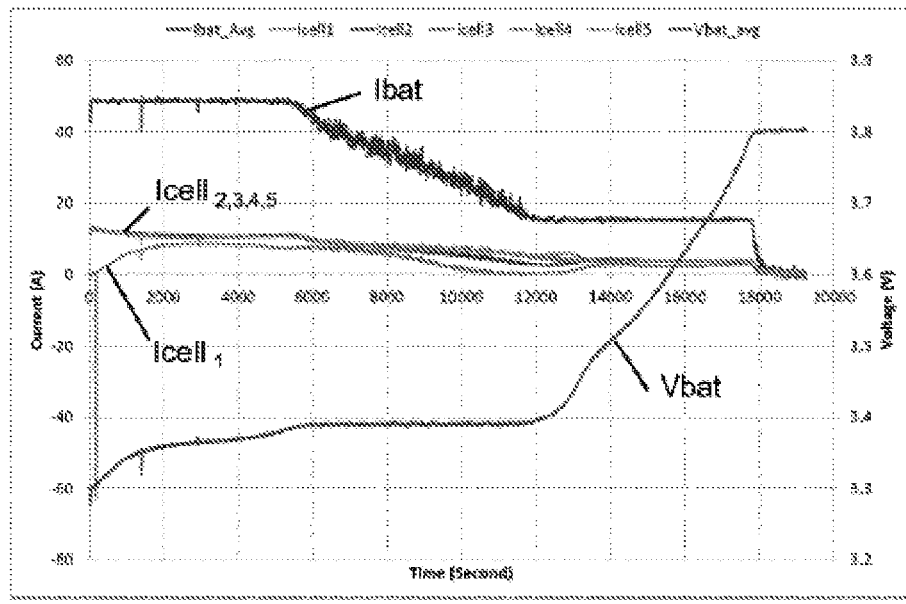
FIGS. 13 to 18 show results obtained by simulation making it possible to compare a conventional management method with a management method according to the invention.

FIG. 13 shows the evolution of the current Ibat and the voltage Vbat of the battery during charging, as well as the evolution of the currents in each electrochemical element Icell_p for p=1 to 5 in the case where the charging of the battery is managed using a method according to the first embodiment of the invention.

It is noted that when the currents are exceeded this is slight and only at low state of charge, which is a zone where the negative electrode supports higher charging currents. The setpoint IMR_C is not exceeded at high state of charge over the constant-current phase.

The charging time is close to the optimum charging time taking into consideration the maximum charging current of 10 A.

Of course, other regulations are possible, such as for example a regulation at constant voltage with the threshold Vcontrol_C using for example a control of the current of the proportional integral type or any other regulation known to a person skilled in the art.

A second simulated system is a battery comprising 10 elements of the NCA/LFP type connected directly in parallel. This time a finer current regulation is used in order to optimize the duration called "balancing".

To this end, the battery is charged according to a setpoint current equal to IMR_C*p (with p=10 here). The regulation is carried out according to an algorithm called "Maximum Regen Intensity Maximum Discharge Intensity" or IMRIMD according to the method described in the U.S. Pat. No. 7,940,027. During this regulation step, IMR_C is equal to the allowed continuous charging value, and the pulsed currents IMR are allowed while the internal variable relating to the overload capacity Cap in this IMRIMD algorithm is positive. The overload capacity Cap is defined as the integral of the difference between the instantaneous charging current and the maximum continuous current charge. It decreases when the difference between the values of the maximum allowed pulsed charging and continuous charging currents is positive (IMR-IMR_C>0) and conversely. The aim of the invention is for IMR_C not to be exceeded for each element, on penalty of a risk of over-ageing of the element in question.

First case: Continuous charging
  Characteristic of the battery
    Battery of 10 elements connected directly in parallel of the NCA/LFP type
    One of the electrochemical elements is initially charged to 30% (SOC_cell1=30%), another to 50% (SOC-cell10=50%) and the other 8 to 40% (SOC-cellp=40% for p=2 to 9).
  Characteristic of the electrochemical elements FIG. 14 shows the charging profile of the electrochemical elements used in the simulations. The mean value of the plateau E0_plateau is 3.333 V and the end of charge voltage Veoc is 3.8 V.
The value of the internal resistances is 1.1 mOhm and the maximum charging current per element is IMR_C=100 A.

Figure 15:
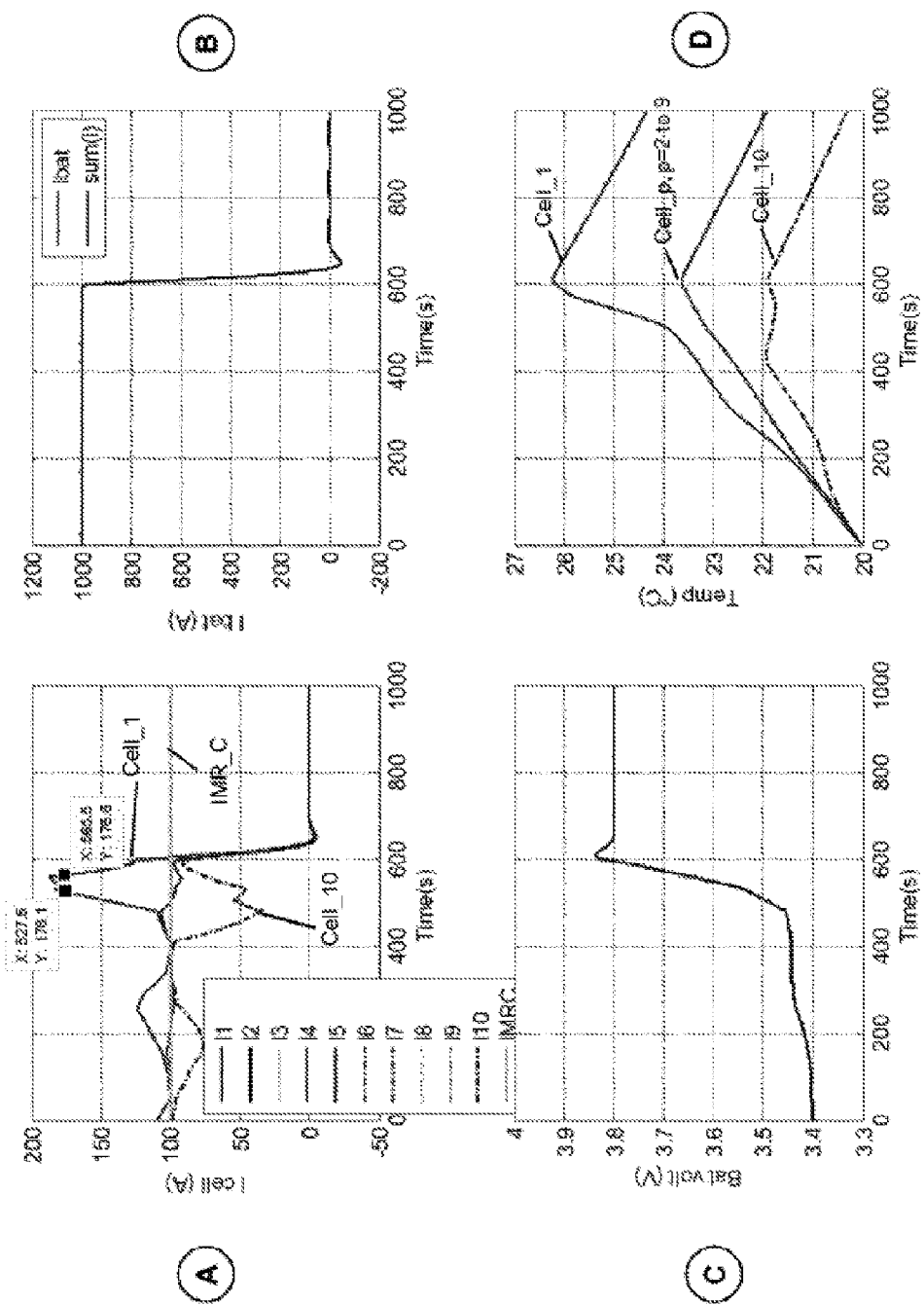

FIG. 15 shows the results obtained by simulation according to a conventional management method of the CCCV type limited by 10×100 A in current and 3.8V in voltage for a regulation of the proportional integral type.

FIG. 15A shows the evolution of the currents in each electrochemical element Icell_p for p=1 to 10 during charging.

FIGS. 15B and C show respectively the evolution of the current Ibat and the voltage Vbat of the battery during charging.

FIG. 15D shows the evolution of the temperature of the electrochemical elements Icell_p for p=1 to 10 during charging.

It is noted that this conventional charging leads to a current of more than 175 A at the end of charge (for t>400 s) for 38 s in the element that was charged the least initially cell_1, while the maximum allowed charging current is 100 A, thus causing a premature ageing of the battery.

Figure 16:
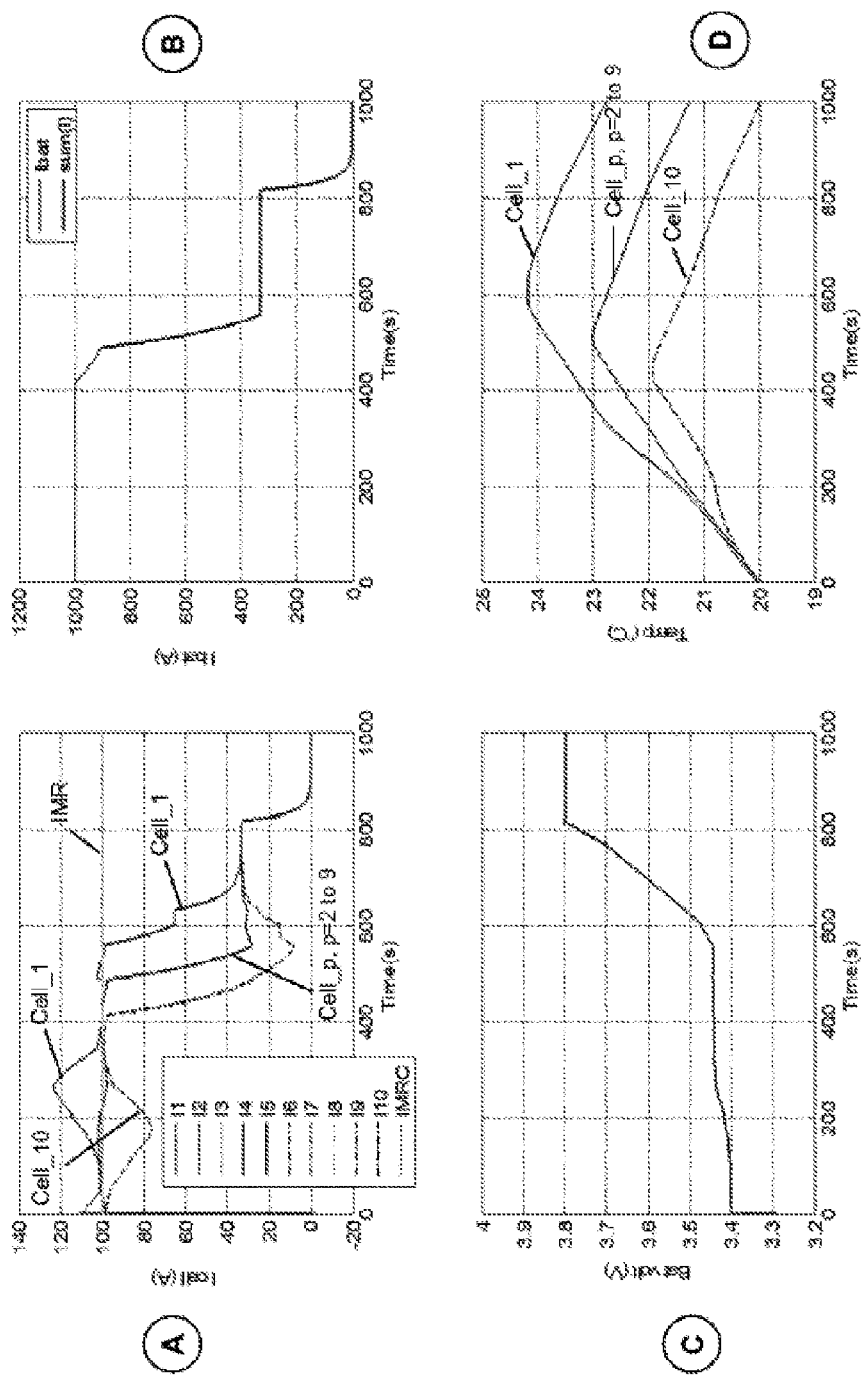

FIG. 16 shows the results obtained by simulation according to a management method according to the invention in which the end of charge coefficient is equal to p/3, i.e. 10/3, and using a regulation of the proportional integral type.

FIG. 16A shows the evolution of the currents in each electrochemical element Icell_p for p=1 to 10 during charging.

FIGS. 16B and C show respectively the evolution of the current Ibat and the voltage Vbat of the battery during charging.

FIG. 16D shows the evolution of the temperature of the electrochemical elements Icell_p for p=1 to 10 during charging.

It is noted that the maximum end of charge current (for t>400 s) complies with the current setpoint of 100 A given for this element, and therefore eliminates any risk of premature ageing of the element.

In addition, the charging time is optimum, because the element cell1 which receives the most current exactly follows the maximum current setpoint that the element can support, except at end of charge. There is no reduction in performance of the battery.

Second case: Pulsed-mode charging
  Characteristic of the battery
    Battery of 10 elements connected directly in parallel of the NCA/LFP type
    All of the electrochemical elements are initially charged to 65% (SOC_cellp=65%).
  Characteristic of the electrochemical elements FIG. 14 shows the charging profile of the electrochemical elements used in the simulations. The mean value of the plateau E0_plateau is 3.333 V and the end of charge voltage Veoc is 3.8 V.
The value of the internal resistances is 1.1 mOhm for the elements 1 to 5 and 2.2 mOhm for the elements 6 to 10.
The maximum continuous charging current per element is IMR_C=100 A and the maximum pulsed charging current per element: IMR=150 A for 10 s.

Figure 17:
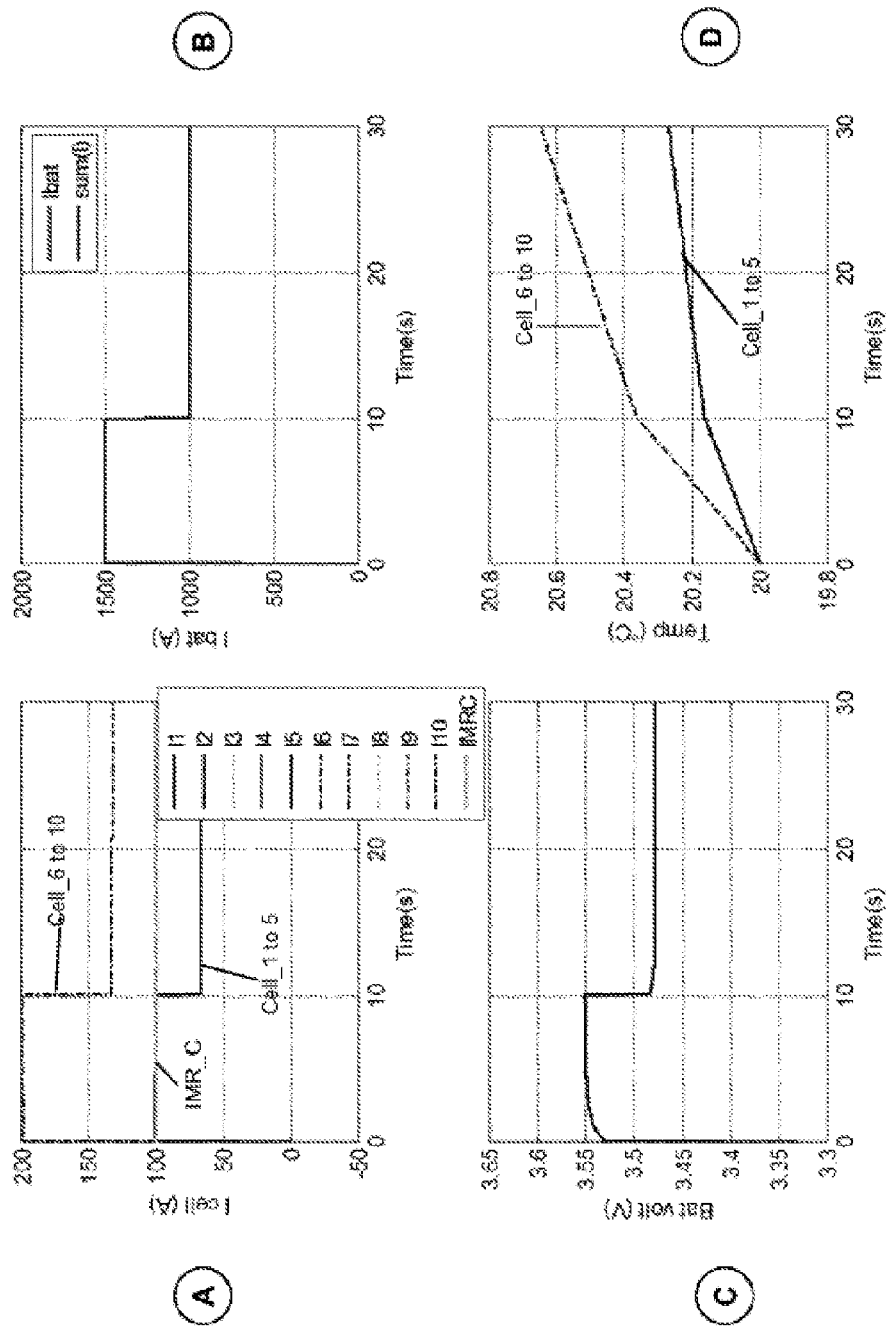

FIG. 17 shows the results obtained by simulation according to a conventional management method of the CCCV type limited in current by 10*150 A for 10 s then to 10*100 A and 3.8V in voltage using a regulation of the proportional integral type.

FIG. 17A shows the evolution of the currents in each electrochemical element Icell_p for p=1 to 10 during charging.

FIGS. 17B and C show respectively the evolution of the current Ibat and of the voltage Vbat of the battery during charging.

FIG. 17D shows the evolution of the temperature of the electrochemical elements Icell_p for p=1 to 10 during charging.

This conventional charging leads to a pulsed current of 200 A over the elements 1 to 5 for the 10 s of pulse allowed at 150 A, then also an overcharge during the phase after the pulse, thus resulting in a premature ageing of the battery.

Figure 18:
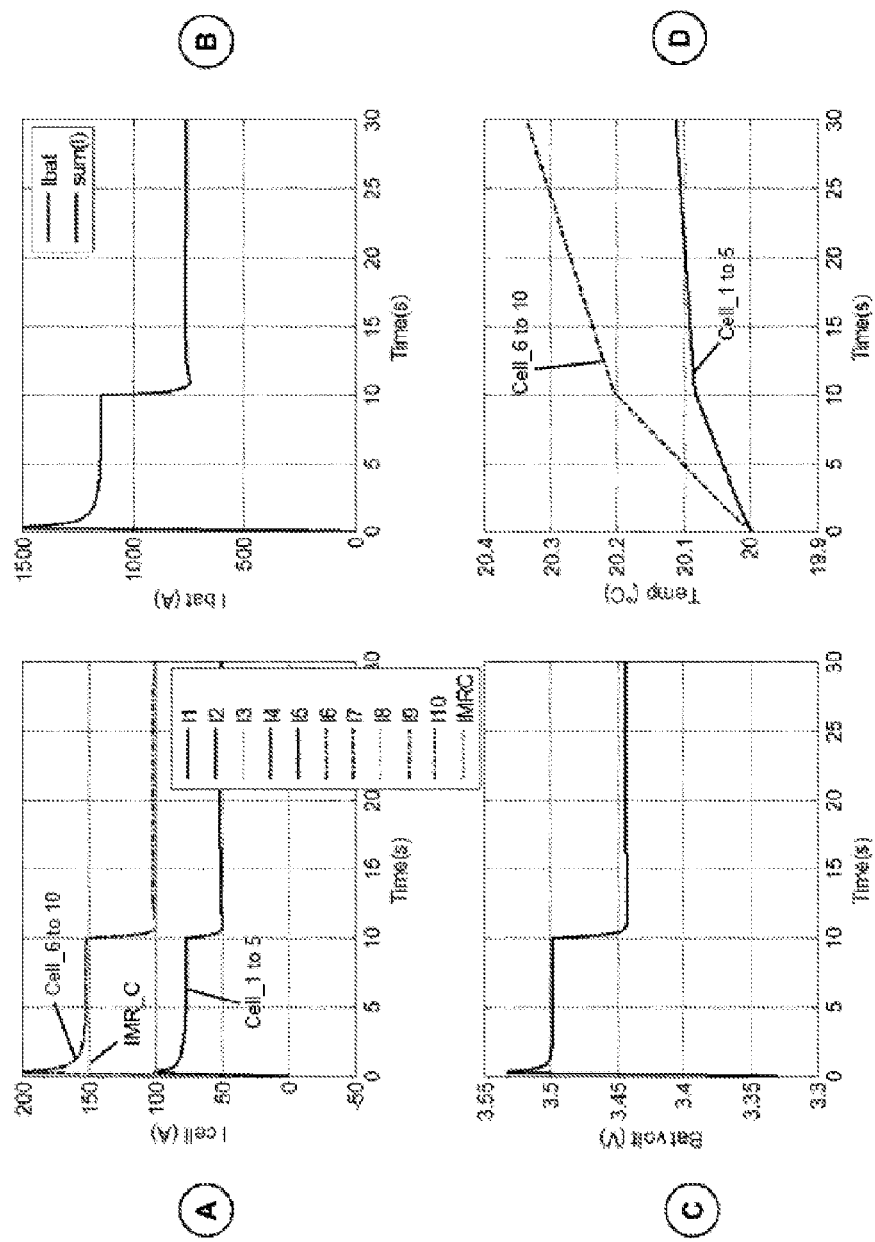

FIG. 18 shows the results obtained by simulation according to a management method according to the invention in which the end of charge coefficient is equal to p/3, i.e. 10/3, and using a regulation of the proportional integral type.

FIG. 18A shows the evolution of the currents in each electrochemical element Icell_p for p=1 to 10 during charging.

FIGS. 18B and C show respectively the evolution of the current Ibat and of the voltage Vbat of the battery during charging.

FIG. 18D shows the evolution of the temperature of the electrochemical elements Icell_p for p=1 to 10 during charging.

The maximum charging current complies with the setpoint of 150 A given per pulse after the characteristic response time of the regulator, then 100 A for all of the elements, and therefore eliminates any risk of premature ageing of the elements.

In addition, the charging time is optimum, because the current of the elements which receive the most current exactly follows the maximum current setpoint that they can support. There is therefore no reduction in performance of the battery.

The alternative solution to make sure that the battery is not over-aged would be to charge it at a maximum allowed current IMR at the battery of 150 A then 100 A. However, the charging time would be multiplied by 10, which would be a very great reduction in performance of the battery.

The invention claimed is:

1. Method for managing the charging of a rechargeable battery using a voltage control or using an intensity control comprising a plurality of branches connected in series, each branch comprising a plurality of electrochemical elements connected in parallel, each electrochemical element having a charging profile comprising at least one plateau zone directly followed by a sloping zone in which the voltage variation as a function of the state of charge in the plateau zone is on average at least ten times slower than the voltage variation in the sloping zone, said method comprising the following steps:
a) providing characteristic data of the electrochemical elements, the characteristic data comprising at least:
a predetermined function representing the variation in the value of the internal resistance of an electrochemical element of the battery as a function of the temperature,
a value of predetermined maximum charging current for an element allowed as a function of the temperature, and
the mean value of the voltage in the plateau zone,
b) real-time measurement of the voltage at the terminals of each branch of electrochemical elements connected in parallel;
c) real-time measurement of the temperature of the rechargeable battery;
d) real-time evaluation of a control voltage equal to the sum of the mean value of the voltage in the plateau zone and the product of the value of the internal resistance of an electrochemical element and the value of the predetermined maximum charging current allowed as a function of the measured temperature;
and in the case of an intensity control:
e1) real-time evaluation of the maximum voltage of the electrochemical elements of the battery defined as being the maximum of the measured voltages at the terminals of each branch;
e2) real-time evaluation of a threshold maximum instantaneous charging current passing through the electrochemical elements connected in parallel as a function of the evaluated control voltage, by regulating the threshold maximum instantaneous charging current so that the maximum voltage of the electrochemical elements is equal to the evaluated control voltage;
e3) real-time determination of a maximum instantaneous charging current to be applied to the electrochemical elements, in which the maximum instantaneous charging current is equal to the minimum between the evaluated threshold maximum instantaneous charging current and the product of the number of electrochemical elements per branch and the predetermined maximum allowed charging current; and
e4) real-time transmission of the value of the determined maximum instantaneous charging current to a charger regulator integrated in the battery so as to power the electrochemical elements of the battery with an intensity less than or equal to the maximum of the determined maximum instantaneous charging current;
and in the case of a voltage control:
f) real-time transmission of the value of the evaluated control voltage to a charger regulator integrated in the battery so as to power the electrochemical elements of the battery.

2. Method for managing charging according to claim 1, comprising a step of measurement of the state of charge of each electrochemical element and/or the ageing state of each electrochemical element, and in which the step of providing the characteristic data of the electrochemical elements is replaced with another step of providing characteristic data of the electrochemical elements comprising at least:
a predetermined function representing the variation in the value of the internal resistance of an electrochemical element of the battery as a function of the temperature and the state of charge of each electrochemical element and/or the ageing state of each electrochemical element,
a value of predetermined maximum charging current allowed as a function of the temperature and the state of charge of each electrochemical element and/or the ageing state of each electrochemical element, and
the value of the voltage in the plateau zone as a function of the temperature and the state of charge of each electrochemical element and/or the ageing state of each electrochemical element; and
in which the step of real-time evaluation of the control voltage is replaced with another step of real-time evaluation of the control voltage equal to the sum of the mean value of the voltage in the plateau zone and the product of the value of the internal resistance of an electrochemical element and the value of the predetermined maximum charging current allowed as a function of the measured temperature, and the measured state of charge of each electrochemical element and/or the measured ageing state of each electrochemical element.

3. Method for managing charging according to claim 1, comprising the following steps:
   g1) providing the value of the end of charge voltage of the electrochemical elements;
   g2) providing a predetermined end of charge coefficient, the coefficient being less than the number of electrochemical elements connected in parallel in each branch; and
in the case of an intensity control, before the step e4) of real-time transmission of the value of the maximum instantaneous charging current to a charger regulator integrated in the battery:
   h1) after the step e3) of real-time determination of the maximum instantaneous charging current to be applied to the electrochemical elements, a step of real-time determination of a first intermediate maximum instantaneous charging current equal to the maximum between the evaluated threshold maximum instantaneous charging current and the product of the predetermined maximum allowed charging current and the end of charge coefficient is carried out;
   h2) in parallel with steps e), e3) and h1), a second intermediate maximum instantaneous charging current is evaluated in real time as a function of the value of the end of charge voltage, by regulating the second threshold maximum instantaneous charging current so that the maximum voltage of the electrochemical elements is equal to the end of charge voltage;
   h3) real-time determination of a maximum instantaneous charging current to be applied to the electrochemical elements, in which the maximum instantaneous charging current is equal to the minimum between the evaluated first and second intermediate maximum instantaneous charging currents;
and in the case of a voltage control, before the step d of real-time evaluation of a control voltage, the following steps are carried out:
   i3) updating of a recorded end of charge variable, initially equal to zero; and
   i4) for as long as this end of charge variable equals zero, the following are carried out:
      the step d) of real-time evaluation of a control voltage; and
      if the value of the instantaneous current of the battery is greater than the product of the end of charge coefficient and the value of the predetermined maximum allowed charging current, the value of the control voltage evaluated in step d) is transmitted in real time to a charger regulator integrated in the battery so as to power the electrochemical elements of the battery;
   i5) if this end of charge variable equals one or if the value of the instantaneous current of the battery is less than or equal to the product of the end of charge coefficient and the value of the predetermined maximum allowed charging current, a step of evaluation of a second control voltage is carried out, by regulating the predetermined maximum allowed instantaneous charging current so that the value of the instantaneous current of the battery is equal to the product of the end of charge coefficient and the value of the predetermined maximum allowed charging current; and
      if this evaluated second control voltage is less than the end of charge voltage, the evaluated second control voltage is transmitted in real time to a charger regulator integrated in the battery so as to power the electrochemical elements of the battery;
      otherwise the end of charge voltage is transmitted in real time to a charger regulator integrated in the battery so as to power the electrochemical elements of the battery.

4. Method for managing charging according to claim 1, in which the electrochemical elements are suitable for continuous or pulsed charging.

5. Method for managing charging according to claim 3, in which the electrochemical elements are suitable for continuous or pulsed charging.

6. Method for managing charging according to claim 3, in which the end of charge coefficient is equal to 1.

7. Method for managing charging according to claim 4, in which the end of charge coefficient is equal to 1.

8. Method for managing charging according to claim 5, in which the end of charge coefficient is equal to 1.

9. Method for managing charging according to claim 3, in which the end of charge coefficient is comprised between a third and half of the number of electrochemical elements per branch.

10. Method for managing charging according to claim 4, in which the end of charge coefficient is comprised between a third and half of the number of electrochemical elements per branch.

11. Method for managing charging according to claim 5, in which the end of charge coefficient is comprised between a third and half of the number of electrochemical elements per branch.

12. Battery charging regulator comprising a memory comprising a program which implements the method according to claim 1, in which the regulator limits, or provides information making it possible to limit, the charging current to the determined value of the maximum allowed instantaneous charging current.

13. Rechargeable battery comprising at least two branches connected in series, each branch comprising at least two electrochemical elements connected in parallel and a charging regulator according to claim 12, each electrochemical element having a charging profile comprising at least one plateau zone directly followed by a sloping zone in which the voltage variation as a function of the state of charge in the plateau zone is on average at least ten times slower than the voltage variation in the sloping zone.

14. Battery according to claim 13, in which each electrochemical element is of the lithium-ion type.

15. Battery according to claim 13, in which each electrochemical element is of the lithium-ion type comprising at least one active substance for the positive electrode chosen from the list consisting of:
   a compound with the formula $Li_xMn_{1-y-z}M'_yM''_zPO_4$ where M' and M" are chosen from the group consisting of B, Mg, Al, Si, Ca, Ti, V, Cr, Fe, Co, Ni, Cu, Zn, Y, Zr, Nb and Mo, and in which M' and M" are different from each other, $0.8 \leq x \leq 1.2$, $0 \leq y \leq 0.6$ and $0 \leq z \leq 0.2$; and
   a compound with the formula $Li_xFe_{1-y}M_yPO_4$ where M is chosen from the group consisting of B, Mg, Al, Si, Ca, Ti, V, Cr, Mn, Co, Ni, Cu, Zn, Y, Zr, Nb and Mo, and in which $0.8 \leq x \leq 1.2$ and $0 \leq y \leq 0.6$.

16. Battery according to claim 13, in which each electrochemical element is of the lithium-ion type the positive electrode of which comprises:
   a) a lithium-containing oxide comprising aluminium and transition metals containing at least nickel and cobalt; and
   b) a lithium-containing phosphate of at least one transition metal;

and the surface of the positive electrode of which is at least partially covered with a layer of carbon; and
in which the proportion by mass of the lithium-containing oxide of transition metals containing at least nickel, cobalt and aluminium is less than or equal to 10% of the weight of the composition;
and in which the proportion by mass of the lithium-containing phosphate of at least one transition metal is greater than or equal to 90% of the weight of the composition.

17. Computer program product comprising at least one sequence of instructions stored on and accessible to a processor, where execution by the processor leads to the implementation of the steps of claim 1.

18. Computer-readable data medium, making it possible to implement at least one of the sequences of instructions of the computer program product of claim 17.

* * * * *